United States Patent
Kofuji et al.

(10) Patent No.: US 6,332,425 B1
(45) Date of Patent: Dec. 25, 2001

(54) SURFACE TREATMENT METHOD AND SYSTEM

(76) Inventors: Naoyuki Kofuji, La Kabina De Amichi 303, 14-23, Naka-1-chome, Kunitachi-shi; Shin Arai, Perunino II-203, 6-5, Josuihoncho-5-chome, Kodaira-shi; Kazunori Tsujimoto, Sakuragaoka Danchi 5-305, 44-17, Sakuragaoka-3-chome, Higashiyamato-shi; Tatsumi Mizutani, 13-15-402, Nukuiminamicho-3-chome, Koganei-shi; Keizo Suzuki, 5-9-401, Josuihoncho-6-chome, Kodaira-shi; Kenichi Mizuishi, 19-13, Nanyodai-2-chome, Hachioji-shi, all of (JP)

( * ) Notice: Subject to any disclaimer, the term of this patent is extended or adjusted under 35 U.S.C. 154(b) by 0 days.

(21) Appl. No.: 09/525,124

(22) Filed: Mar. 14, 2000

Related U.S. Application Data

(62) Division of application No. 08/548,613, filed on Oct. 26, 1995, now Pat. No. 6,231,777.

(30) Foreign Application Priority Data

Nov. 4, 1994 (JP) .................................................. 6-293688

(51) Int. Cl.[7] .................................................. C23C 16/00
(52) U.S. Cl. .......................... 118/723 MA; 118/723 MR; 118/723 ME; 118/723 MW; 216/71
(58) Field of Search ........................ 156/345; 118/723 E, 118/723 ER, 723 MR, 723 MA, 723 ME, 723 MW; 315/111.21; 438/311, 274, 238, 571, 46; 257/511; 216/71, 2; 73/780; 349/43; 427/489, 458, 142; 414/9; 428/553; 264/469

(56) References Cited

U.S. PATENT DOCUMENTS

| | | | |
|---|---|---|---|
| 4,992,719 | * | 2/1991 | Harvey ..................................... 363/59 |
| 5,384,682 | * | 1/1995 | Watanabe et al. .................... 361/234 |
| 5,423,936 | * | 6/1995 | Tomita et al. ......................... 156/345 |
| 5,561,585 | * | 10/1996 | Barnes et al. ......................... 361/234 |
| 5,593,540 | * | 1/1997 | Tomita et al. ......................... 438/710 |
| 5,648,293 | * | 7/1997 | Hayama et al. ....................... 438/485 |
| 5,660,694 | * | 8/1997 | Ohmi et al. ....................... 204/192.12 |
| 5,661,043 | * | 8/1997 | Rissman et al. ....................... 438/162 |
| 5,807,780 | * | 9/1998 | Davis et al. ......................... 438/311 |
| 5,812,362 | * | 9/1998 | Ravi ..................................... 361/234 |
| 5,821,171 | * | 10/1998 | Hong et al. ......................... 438/767 |
| 5,841,623 | * | 11/1998 | Denison et al. ...................... 361/234 |
| 5,888,414 | * | 3/1999 | Collins et al. ......................... 216/68 |
| 5,892,264 | * | 4/1999 | Davis et al. ......................... 257/511 |
| 6,068,784 | * | 5/2000 | Collins et al. ......................... 216/68 |

OTHER PUBLICATIONS

D.R. Akerman et al, "Generation of electron and ion beams in a modified nanosecond accelerator", Sov.Phys. 31(10), pp. 1156–1160 (abstract), 1986.*
R.P.H. Chang et al, "Plasma enhanced beam deposition of thin dielectric films.", 42(3), pp. 272–274 (abstract), 1983.*
Jin Onuki etal, "High–reliability interconnection formation by a two–step switching bias sputtering process", Thin Solid Films, 182–188.*

* cited by examiner

Primary Examiner—Gregory Mills
Assistant Examiner—Rudy Zervigon

(57) ABSTRACT

A pulse voltage of duty ratio 5% or below and repetition frequency 400 KHz or above is supplied in order to suppress the notch, charge build-up damage, subtrench and bowing due to the electron shading phenomenon. Thus, a cycle for accelerating electrons occurs in the substrate bias, so that the electron shading phenomenon does not occur.

15 Claims, 26 Drawing Sheets

SURFACE TREATMENT METHOD AND SYSTEM

CROSS REFERENCE TO RELATED APPLICATION

This is a divisional of U.S. application Ser. No. 08/548,613, filed Oct. 26, 1995, U.S. Pat. No. 6,231,777 the subject matter of which is incorporated by reference herein.

BACKGROUND OF THE INVENTION

This invention relates to the treatment for the surface of a substance being treated by use of plasma, and particularly to a method of supplying a bias voltage to a substance of which the surface is to be treated.

FIG. 2 shows the most typical conventional biasing method called the RF biasing. A substance 1 to be etched is connected through a capacitor 2 to a high-frequency power supply 3. A sine-wave voltage as shown in FIG. 3 is applied through the capacitor 2 to the substance 1. At this time, since the amount of electrons which a plasma 4 supplies is dozens of times larger than that of ions, negative charges are accumulated on the substance-side of the capacitor 2. Because of the capacitor charges, a voltage shifted in the negative direction as shown in FIG. 4 appears on the substrate. The positive ions for etching are accelerated by this negative voltage and perpendicularly incident on the substrate, thus making it possible to etch the substrate in an anisotropic shape.

Another idea is disclosed in JP-A-56-13480 (laid-open on Feb. 9, 1981) and JP-A-6-61182 (laid-open on Mar. 4, 1994) in which a pulse-waveform voltage is used as a bias voltage. However, the importance of the duty ratio and repetition frequency of a pulse wave has never been considered so far except that the present invention regards them as important.

SUMMARY OF THE INVENTION

As seen from the substrate bias voltage wave shown in FIG. 4, its positive voltage is almost zero although it is required to accelerate the electrons in the positive cycle in which the electrons impinge on the substance. Therefore, the electrons are little accelerated and impinge on the substrate. When fine pattern etching is made by this biasing method, local charge build-up occurs on the substance. FIG. 5 shows the mechanism by which this charge build-up is caused. Since ions 5 are accelerated and perpendicularly impinge on the substance, they can reach the bottom of a fine pattern. Since electrons 6 are not accelerated and isotropically impinge on the substance, they are blocked by a mask 7 so as not to reach the bottom of a fine pattern (electron shading phenomenon). Therefore, the sides of the fine pattern are charged up to have negative charges, and the bottoms of the fine pattern are charged up to have positive charges.

The charge build-up due to this electron shading brings various troubles in the plasma etching. One of the most serious problems is local side etching (notching) which occurs in polycrystalline silicon etching (working) for gate. FIG. 6 shows the mechanism of this notching. The ions 5 of etching species are repelled from the positive charges which are caused on the bottom of the fine pattern by the electron shading phenomenon, and they impinge on the side of the pattern. The ions incident to the side cause a local side etch 10 called notch in the interface between a polycrystalline silicon layer 8 and an underlying silicon dioxide film 9.

The charge build-up due to the electron shading phenomenon also occurs in the metal wiring process, and damages the gate oxide film. FIG. 7 shows this damaging mechanism. The positive charges accumulated on the bottoms of the fine pattern by the electron shading are collected to a floating gate 12 which is connected to a metal wiring conductor 11, and cause damages such as dielectric breakdown to a gate oxide 14 between the floating gate 12 and a substrate silicon 13.

Moreover, the charge build-up due to the electron shading phenomenon causes troubles, or undesirable abnormal shapes such as subtrench or bowing in the etching process for minute holes such as trench and contact hole. FIG. 8 illustrates this generation mechanism. As in the polycrystalline silicon etching, negative charges are accumulated on the sides of a hole and positive charges on the bottom of the hole. This charge build-up deflects the ions 5 which serve as the etching species so that the ions 5 impinge on the sides and bottom corners of the hole. Therefore, the sides and bottom corners of the hole are etched to produce undesirable abnormal shapes such as bowing 15 and subtrench 16.

The present invention is to eliminate the electron shading phenomenon, thereby solving various problems such as notch, charge build-up damage, bowing and subtrench.

According to one aspect of the invention, as shown in FIG. 1, a pulse generator 17 for the bias supply is provided in place of the conventional sine-wave high-frequency power supply. This pulse generator supplies a positive pulse voltage as the bias voltage to the substance being treated. In this case, the duty ratio and repetition frequency of this pulse voltage are selected so that the maximum value of the potential of the substance of which the surface is being processed is higher than that of the above-mentioned plasma. The specific values of the duty ratio and repetition frequency are respectively 5% or below and 400 KHz or above, preferably, 1% or above and 1 MHz or above.

We now consider that the pulse source 17 in FIG. 1 supplies a positive pulse voltage shown in FIG. 9. The instant that the discharge has begun, the capacitor has no charge stored, and the same bias wave as the input voltage as shown in FIG. 10 appears on the substance being treated. When the bias wave is as shown in FIG. 10, the positive cycle in which a great amount of electrons impinges is much shorter than the negative cycle in which a small amount of ions impinges, so that the amount of the negative charges impinging in the positive cycle is equal to that of the positive charges impinging in the negative cycle. Therefore, the total charge in one cycle becomes zero, and as a result no charge is induced on the capacitor 2 in FIG. 1. Accordingly, the substrate bias voltage shown in FIG. 10 is maintained during the etching process. Of the substrate bias voltage wave in FIG. 10, the negative voltage in the negative cycle accelerates ions to impinge the substrate, and the positive voltage in the positive cycle is supplied to the substrate, thus accelerating electrons to perpendicularly impinge on the substance. Therefore, the electrons 6 and ions 5 can impinge up to the bottoms of the fine pattern as illustrated in FIG. 11. In addition, since the total amount of positive and negative impinging charges in one cycle is zero, there is no charge build-up due to the electron shading phenomenon.

The positive cycle time which is much shorter than the negative cycle time and one-cycle time were estimated by simulation. As the parameters for the simulation, the electron density, electron temperature and capacitance value were respectively selected to be $10^{11}/cm^3$, 3 eV, 30 $pF/cm^2$ which are the standard values of the etching system using a high-density plasma. In addition, considering that chlorine gas is used as etching gas, the mass of the ion used in the simulation was selected to be 35.5 au.

First, the substrate bias voltage wave was calculated under the conditions of the supplied pulse voltage 200 V, repetition frequency 10 MHz and duty ratios 1% and 10%. FIGS. 12 and 13 show the results. Referring to these figures, when the duty ratio is as small as 1%, the pulse voltage is risen up much positive to accelerate electrons. In addition, self-bias is generated during the interval between the pulses. When the duty ratio of the pulse is as large as 10%, the pulse has almost no positive part, and thus cannot accelerate electrons.

FIG. 14 shows the relation between the duty ratio and the magnitude of the positive part of this substrate bias voltage wave. This result can be divided into the following three regions.

In the region A in which the duty ratio is 0.5% or below, the magnitude of the electron accelerating voltage appearing on the substrate surface when the pulse is supplied is constant without the effect of the repetition frequency. Etching is made chiefly at a floating potential. The positive charge build-up caused by the electron shading at the floating potential is relieved by the intermittent positive pulse voltage. Therefore, the charge build-up eliminating effect can be increased with the increase of the repetition frequency of the pulse.

In the region B in which the duty ratio is from 0.5% to 5%, the electron accelerating voltage is decreased with the increase of the duty ratio, but higher than the plasma potential. Particularly, when the duty ratio is 1% or below, the magnitude of the electron accelerating voltage is 50% or above of the input pulse peak which is large enough to accelerate electrons. In addition, as described with reference to FIG. 12, if the substrate potential is shifted negative with respect to the input voltage during the interval between the pulses, the self-bias is also generated. Therefore, it is possible both to make high-speed etching by the self-bias and to eliminate the charge build-up by the electron accelerating voltage.

In the region C in which the duty ratio is 5% or above, the electron accelerating voltage does not appear on the substrate surface. Since the substrate potential is shifted too negative with respect to the input voltage, the substrate potential becomes smaller than the plasma potential when the pulse voltage is supplied. Accordingly, the charge build-up cannot be eliminated by the decrease of the electron shading.

Therefore, in order to suppress the electron shading by the application of the pulse bias, it is necessary to select a duty ratio in the region A or B. If a duty ratio is selected from the region A, a large negative bias is not generated on the substrate, and thus it is possible to make high-selectivity etching with a small effect of electron shading phenomenon. When a duty ratio is selected from the region B, the electron shading can be suppressed by the electron accelerating voltage, and ions can be accelerated by the self-bias, so that anisotropic and high-speed etching can be performed.

The same examination was made with respect to the repetition frequency of the pulse. FIGS. 15, 16 and 17 show the substrate bias waves under the conditions of duty ratio 1%, repetition frequencies 10 MHz, 1 MHz and 100 KHz. Referring to these figures, the positive part of the pulse appears at repetition frequencies 10 MHz and 1 MHz, but the positive part almost disappears at repetition frequency 100 KHz. FIG. 18 shows the relation between the repetition frequency and the height of the positive part of the pulse. The height of the positive part of the pulse is suddenly risen up at repetition frequency 400 KHz or above. Particularly at repetition frequency 1 MHz or above, the height of the positive part of the pulse is substantially saturated. Therefore, if the repetition frequency of the pulse is selected to be 400 KHz or above, preferably, 1 MHz or above, a bias voltage enough to accelerate electrons can be supplied to the substance being processed.

The process on a fine pattern was made by using this bias voltage, and the charge build-up was measured. The magnitude of the charge build-up to be measured was defined as the potential difference between the bottom of a fine pattern of 0.3 $\mu$m level and the bottom of a wide pattern of 10 $\mu$m or above. FIG. 40 shows the relation between the magnitude of the charge build-up and the duty ratio. From FIG. 40, it will be seen that the magnitude of the charge build-up is decreased with the increase of the positive part of the pulse illustrated in FIG. 14 and suddenly decreased at duty-ratio 5% or below. Particularly when the duty ratio is in the range from 0.5% to 5%, the charge build-up value is zero.

The same examination was made with respect to the repetition frequency. FIG. 41 shows the relation between the magnitude of the charge build-up and the repetition frequency. From FIG. 41, it will be understood that the magnitude of the charge build-up is decreased with the increase of the positive part of the pulse illustrated in FIG. 18 and suddenly decreased at repetition frequency 400 KHz or above. Particularly when the repetition frequency is 1 MHz or above, the charge build-up value is zero.

Another important parameter of the pulse is the through rate. When the through rate of the pulse is slow, until the substrate potential reaches the plasma potential, the electron current flowing from the plasma causes a voltage drop to be developed across the capacitor that is provided between the substance and the pulse source in FIG. 1, so that no positive potential appears on the substrate. Therefore, in order to generate an electron accelerating voltage on the substrate, it is necessary that the through rate of the pulse be higher than the speed of the voltage drop due to the electron current. If the electron temperature $T_e$, electron density $n_e$ and capacitance value are 3 eV, $10^{11}/cm^3$ and 30 pF/cm$^2$, respectively, the voltage drop speed due to the electron current is calculated to be about $10^3 V/\mu s$. Therefore, it can be considered that a through rate of at least $10^3 V/\mu s$ is necessary to generate an electron accelerating voltage on the substrate. Actually a pulse having pulse width of 1 $\mu s$, magnitude of 100 V and repetition frequency of 1 KHz was supplied and the relation between the through rate of the pulse and the electron accelerating voltage was measured. FIG. 42 shows the result. From this figure, it will be seen that the electron accelerating voltage begins to generate at a through rate of $10^3 V/\mu s$ or above and reaches the maximum at a through rate of $5 \times 10^3 V/\mu s$ or above.

From the above description, it will be understood that in order to eliminate the charge build-up due to the electron shading phenomenon and solve the resulting problems, the pulse bias voltage to be supplied is required to have a duty ratio of 5% or below and a repetition frequency of 400 KHz or above, preferably a duty ratio of 1% or below and a repetition frequency of 1 MHz or above.

Strictly speaking, these thresholds of duty ratio and repetition frequency are specific for the simulation conditions, and slightly changed depending on the etching conditions and etching system. The threshold of duty ratio is in inverse proportion to the mass of the ion. The threshold of repetition frequency is proportional to the square root of electron temperature and electron density, but in inverse proportion to the electrostatic capacitance of the capacitor. However, in the general high density plasma etching, the electron density, electron temperature and electrostatic capacitance of capacitor are the same values as set in the simulation, and the thresholds of duty ratio and repetition frequency are also substantially the same values as set in the simulation.

A description will now be made of the action and effects of the embodiments of the invention on the problems caused by the electron shading phenomenon.

FIG. 19 shows the mechanism of solving the notch-generation problem in the polycrystalline silicon etching (working) for gate by the present invention. According to this invention, since the electrons 6 anisotropically impinge on the pattern, it is possible to eliminate the charge build-up on the bottom and sides of a fine pattern. Therefore, the ions 5 as the etching species are not repelled from the pattern bottom, and thus can produce anisotropic shapes without notch.

FIG. 20 shows the mechanism of removing the charge build-up damage problem in the metal wiring process. Since the positive charge build-up on the fine pattern bottom is avoided, the positive charges are not collected on the floating gate 12, and thus the gate oxide film 14 between the floating gate 12 and the substrate 13 is not damaged.

FIG. 21 shows the mechanism of suppressing the bowing and subtrench in the minute hole working for trench and contact hole. Since the charge build-up is not caused by the electron shading, the ions 5 anisotropically impinge on the substrate, and thus can produces anisotropic shapes with no subtrench and bowing.

DESCRIPTION OF THE PREFERRED EMBODIMENTS

Embodiment 1

Figure 1:
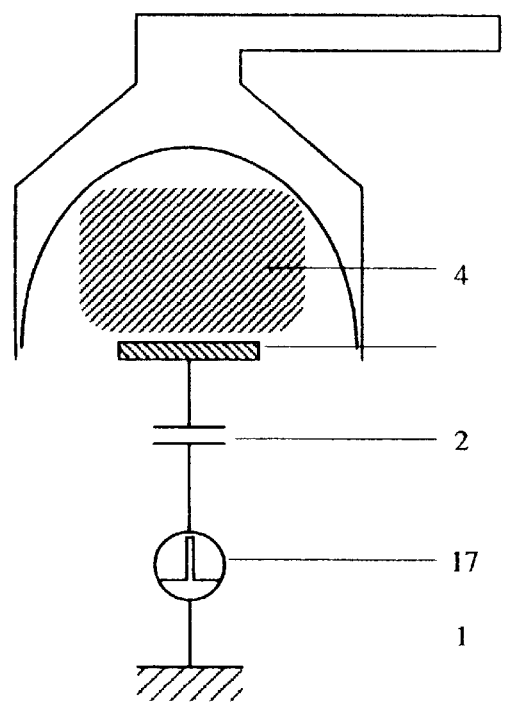
FIG. 1 is a construction diagram of the surface treatment system for use in supplying a pulse bias, according to the present invention.
Figure 2:
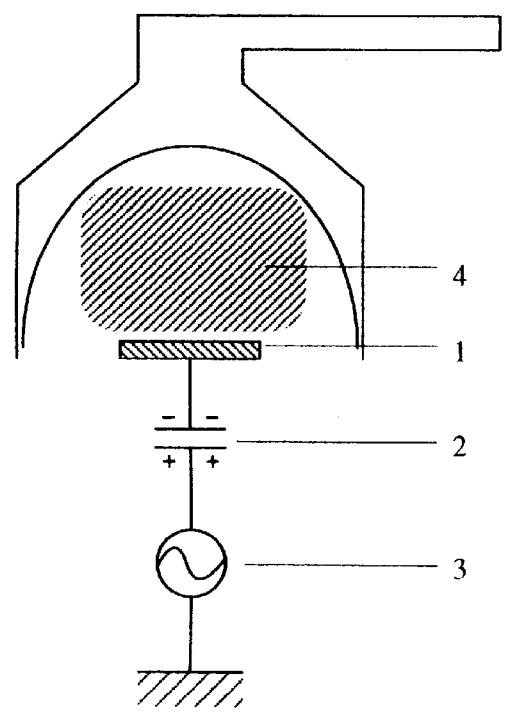
FIG. 2 is a construction diagram of the conventional etching system for use in supplying an RF bias.
Figure 3:
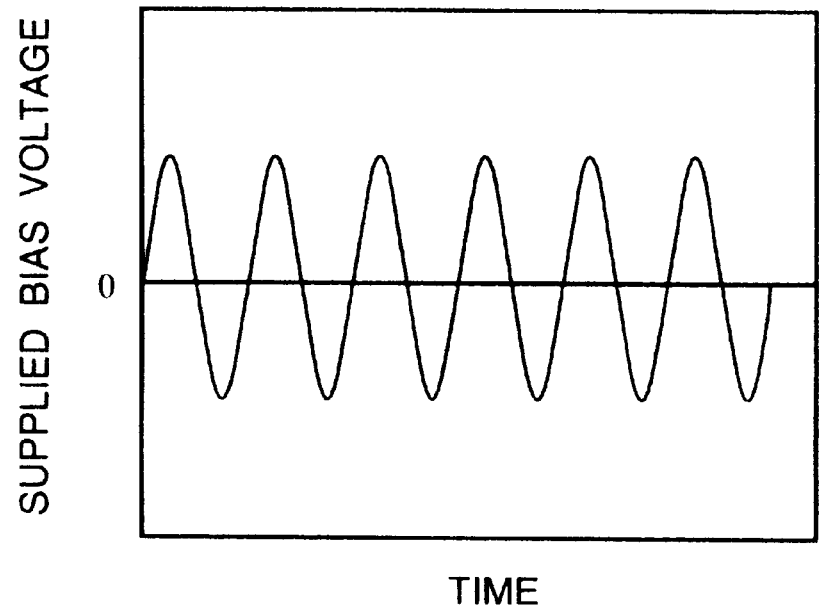
FIG. 3 is a diagram of the supplied bias voltage wave appearing when the RF bias is supplied as in the prior art.
Figure 4:
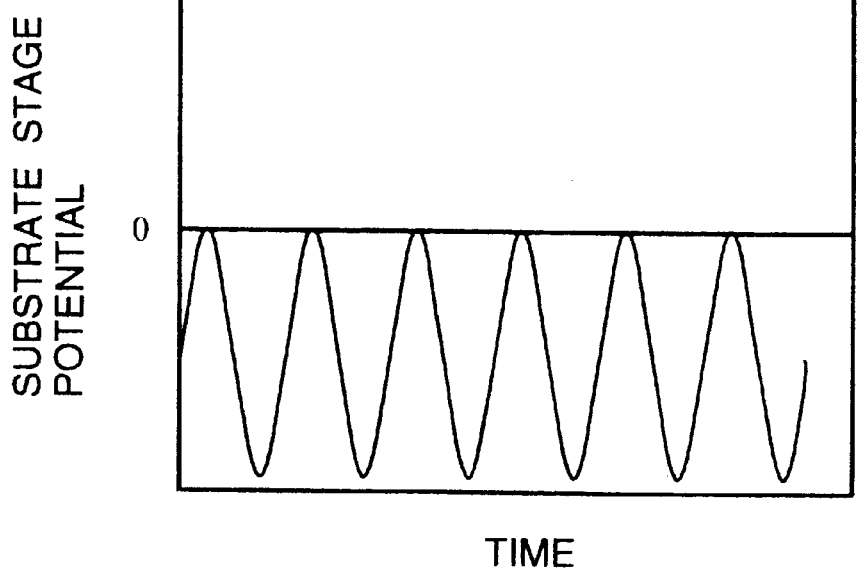
FIG. 4 is a diagram of the substrate bias wave appearing when the RF bias is supplied as in the prior art.
Figure 5:
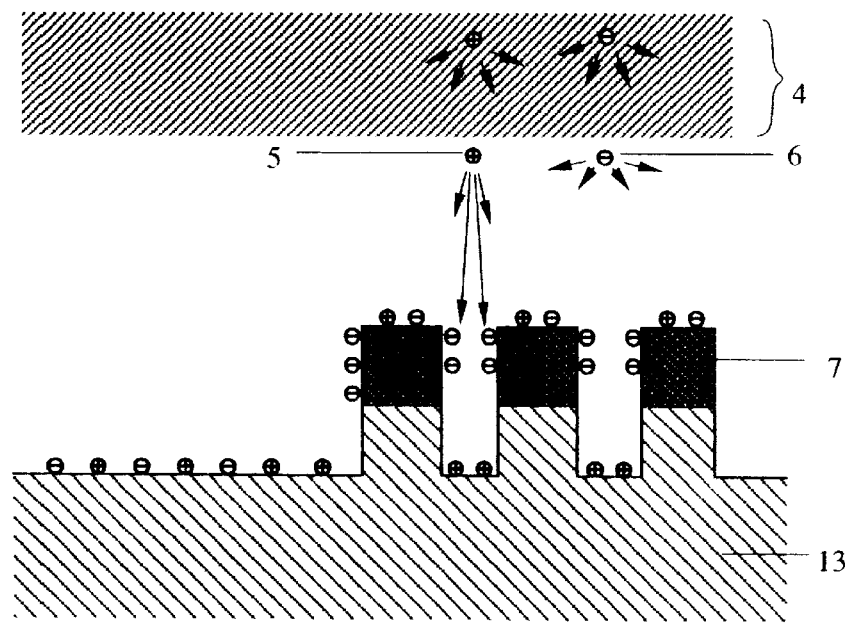
FIG. 5 shows the mechanism of generating the local charge build-up (electron shading phenomenon).
Figure 6:
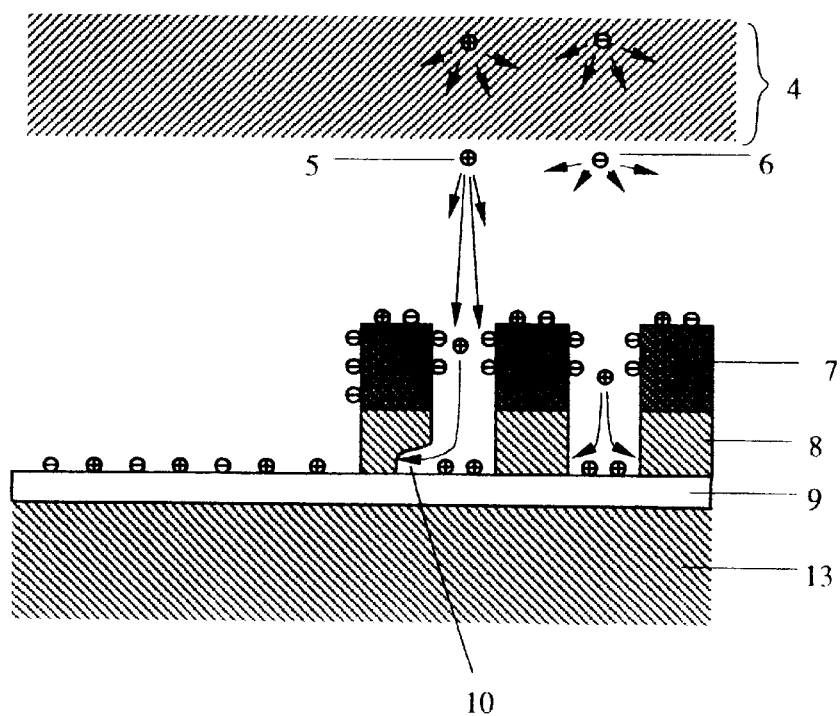
FIG. 6 shows the mechanism of generating the local side etching (notch) in the polycrystalline silicon working for gate.
Figure 7:
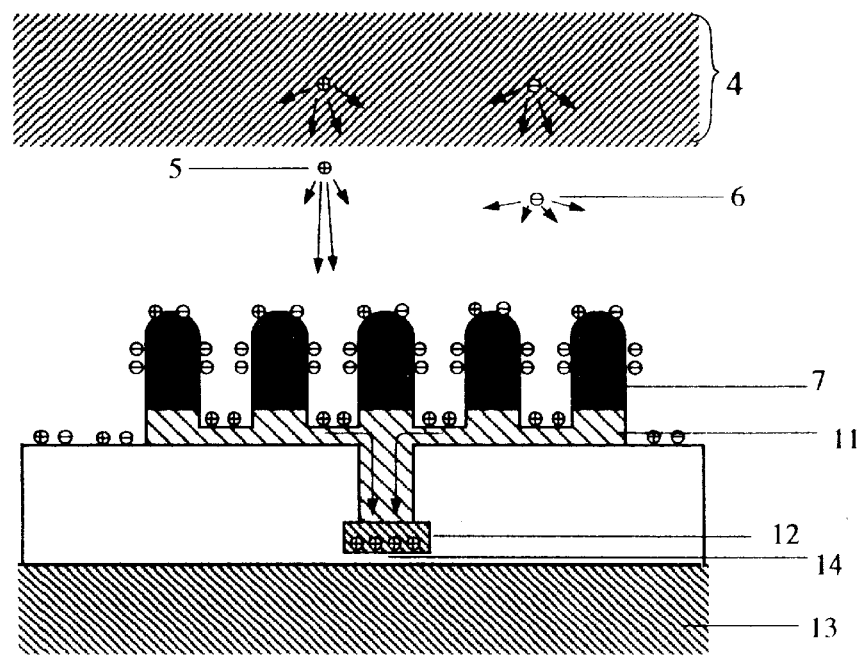
FIG. 7 shows the mechanism of generating a damage to the gate oxide film in the metal wiring process.
Figure 8:
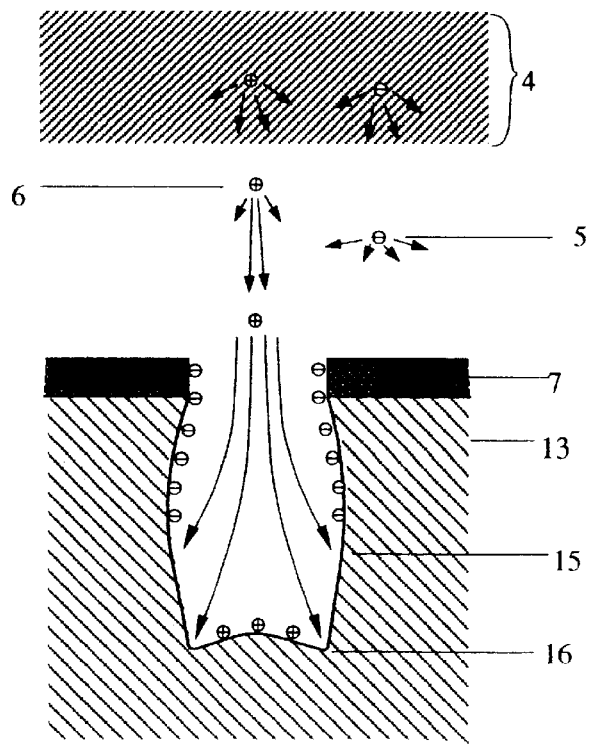
FIG. 8 shows the mechanism of generating the bowing and subtrench in the fine trench working.
Figure 9:
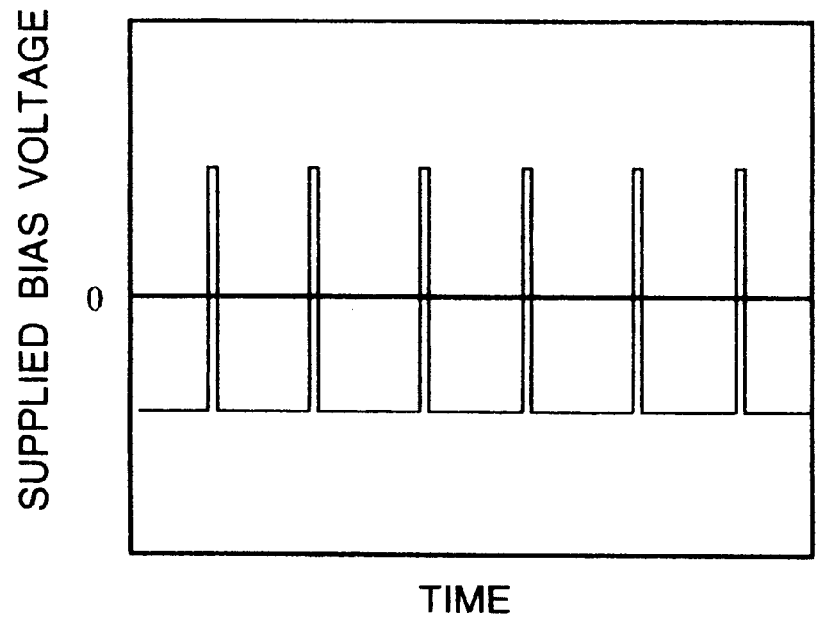
FIG. 9 is a diagram of the bias input voltage wave appearing when the pulse bias according to this invention is supplied.
Figure 10:
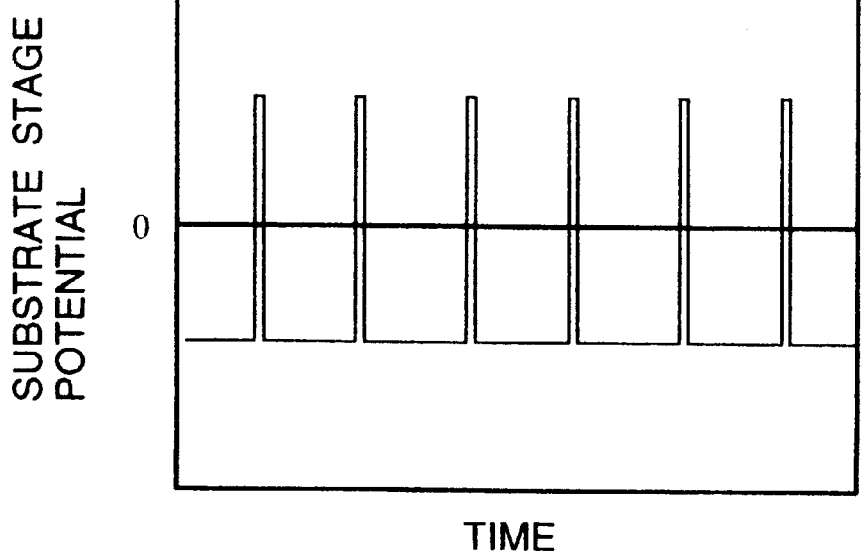
FIG. 10 is a diagram of the substrate bias wave appearing when the pulse bias according to this invention is supplied.
Figure 11:
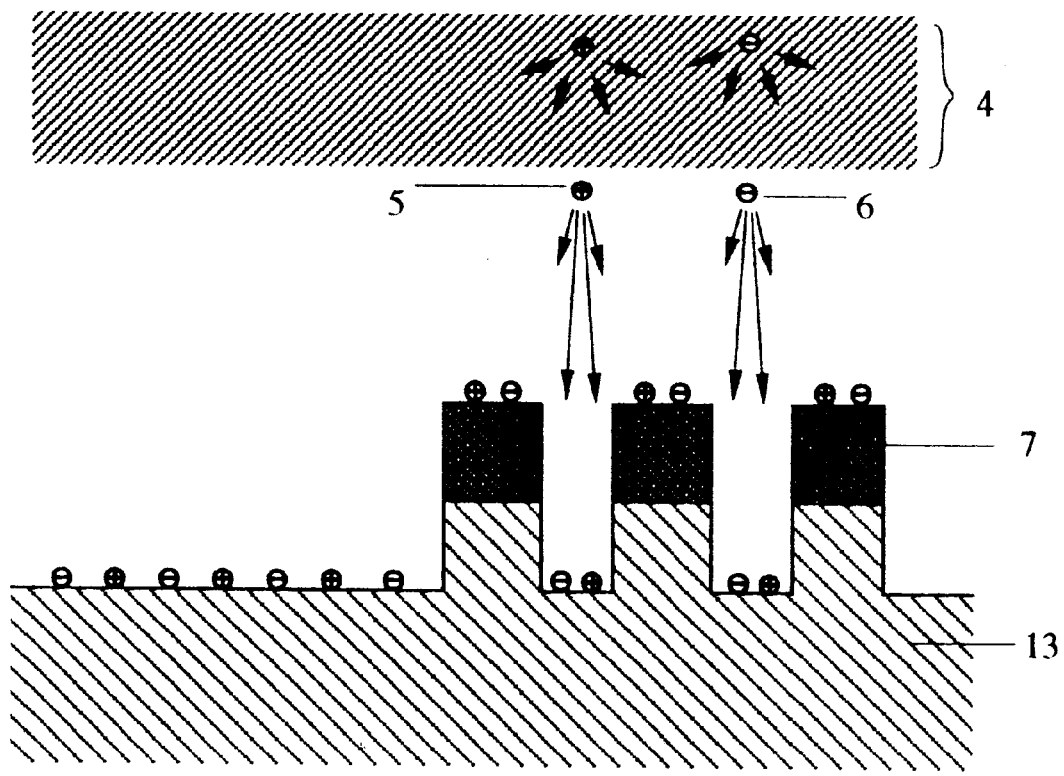
FIG. 11 shows the mechanism of decreasing the local charge build-up according to this invention.
Figure 12:
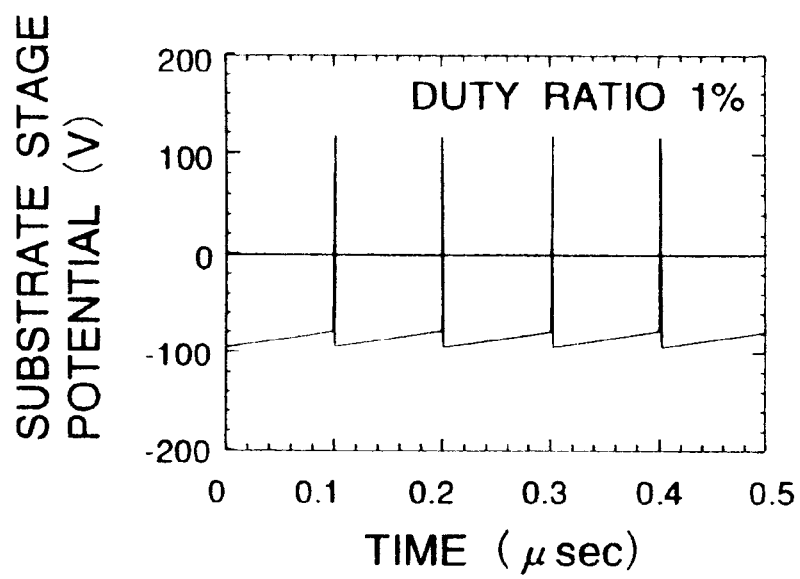
FIG. 12 is a graph showing the substrate bias wave appearing when the input pulse of duty ratio 1% is supplied.
Figure 13:
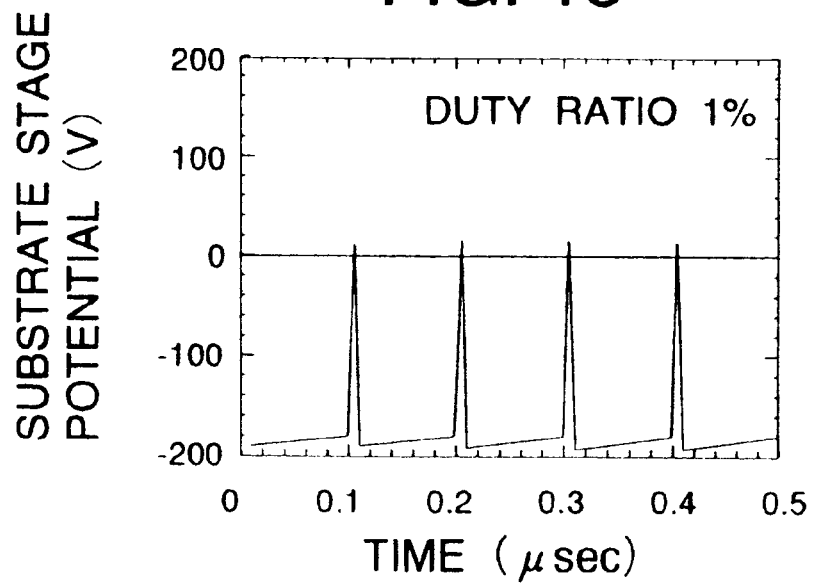
FIG. 13 is a graph showing the substrate bias wave appearing when the input pulse of duty ratio 10% is supplied.
Figure 14:
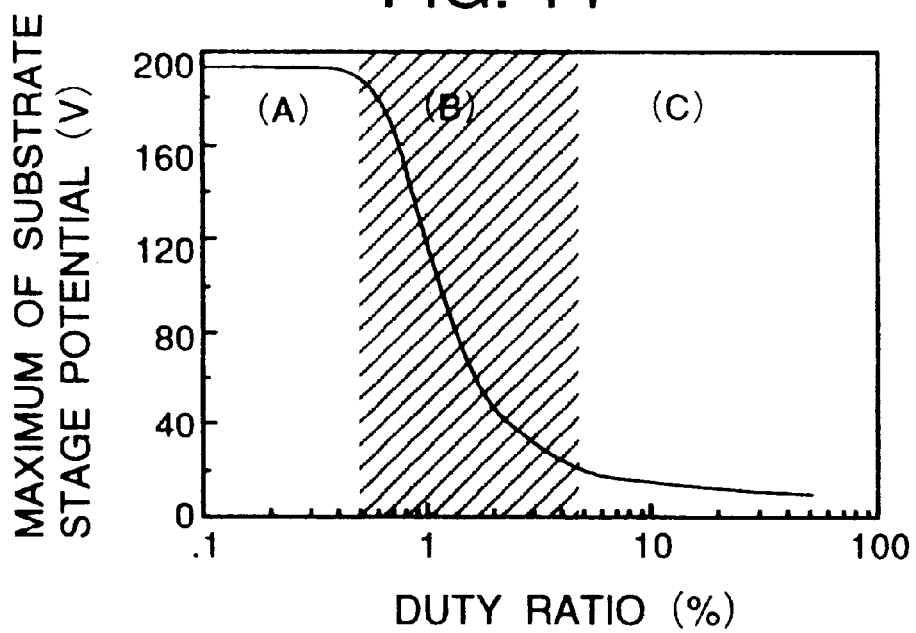
FIG. 14 is a graph showing the relation between the duty ratio of the input pulse and the magnitude of the positive voltage of the substrate bias.
Figure 15:
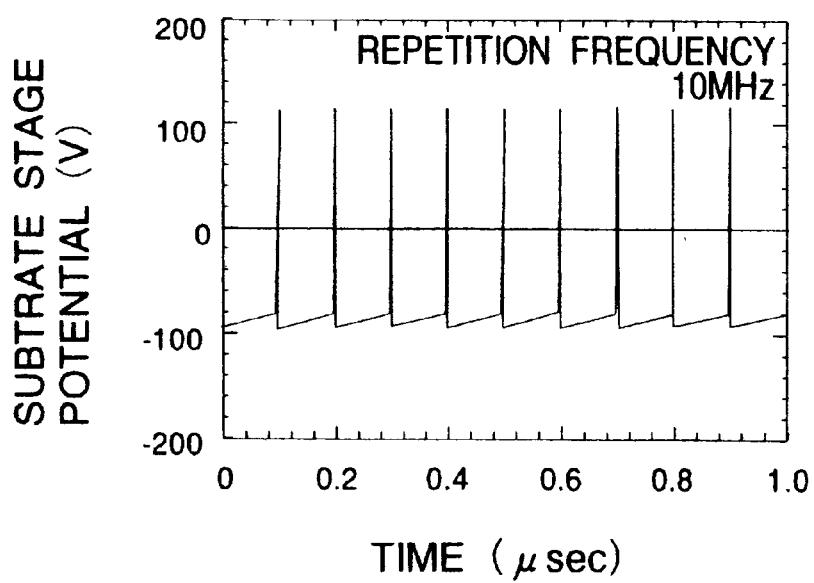
FIG. 15 is a graph showing the substrate bias wave appearing when the input pulse of repetition frequency 10 MHz is supplied.
Figure 16:
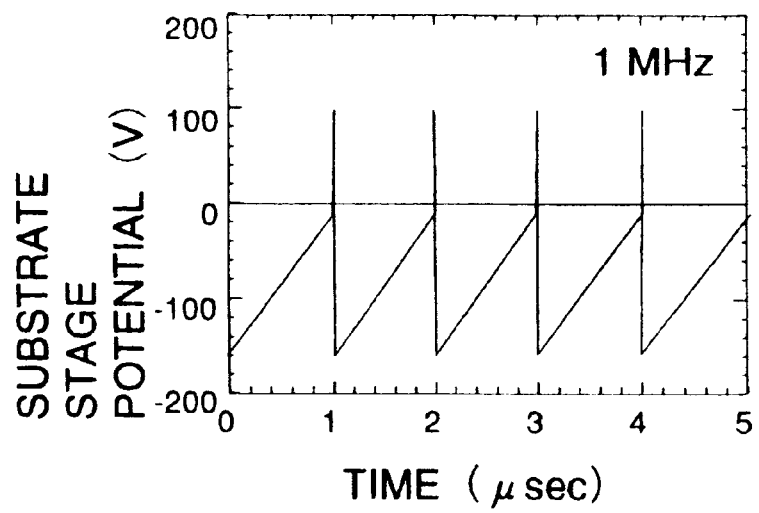
FIG. 16 is a graph showing the substrate bias wave appearing when the input pulse of repetition frequency 1 MHz is supplied.
Figure 17:
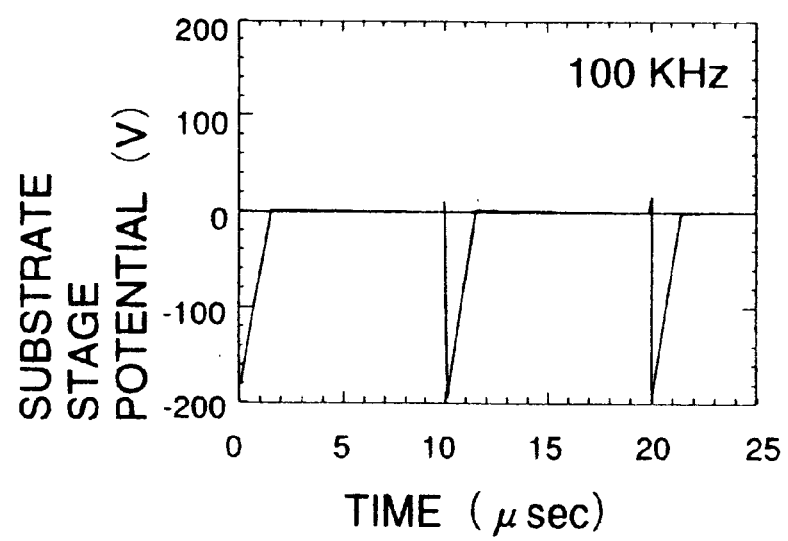
FIG. 17 is a graph showing the substrate bias wave appearing when the input pulse of repetition frequency 100 KHz is supplied.
Figure 18:
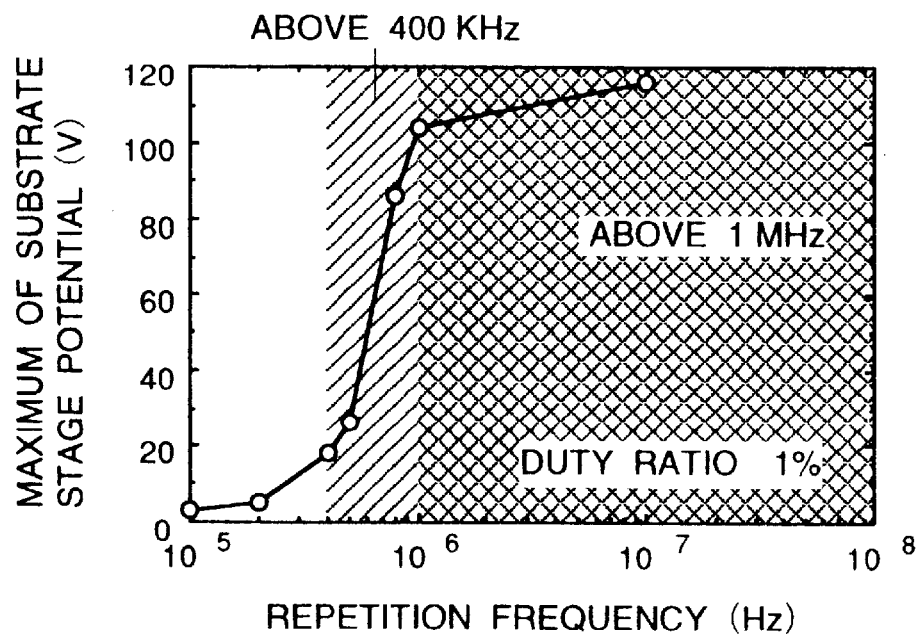
FIG. 18 is a graph showing the relation between the repetition frequency of the input pulse and the magnitude of the positive voltage of the substrate bias.
Figure 19:
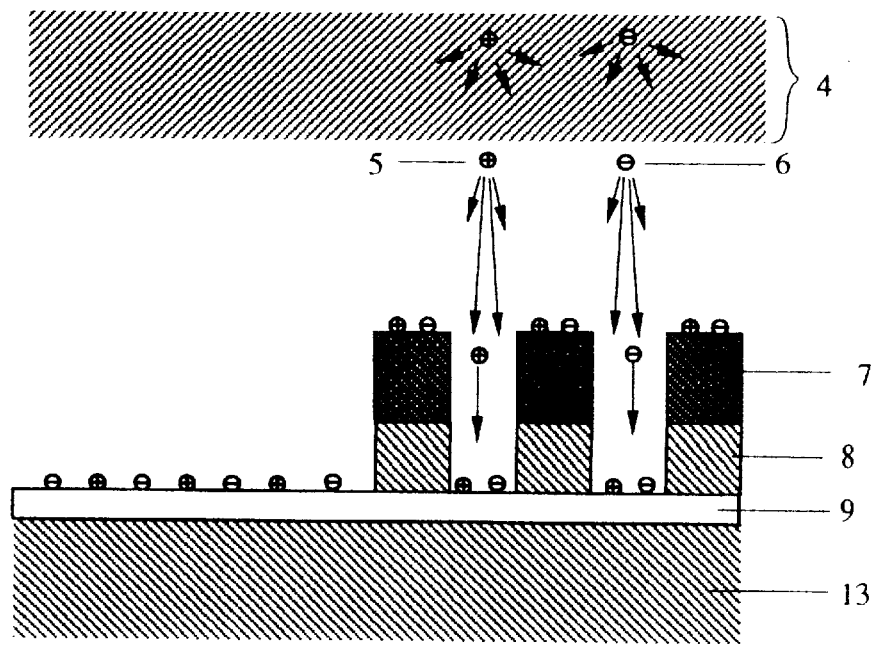
FIG. 19 shows the mechanism of reducing the notch according to this invention.
Figure 20:
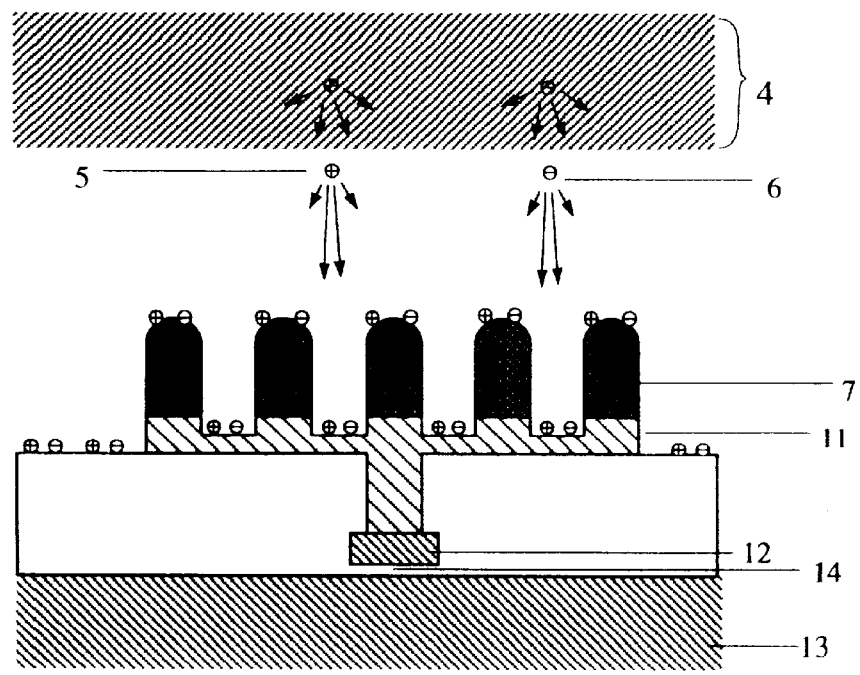
FIG. 20 shows the mechanism of reducing the damage to the gate oxide film according to this invention.
Figure 21:
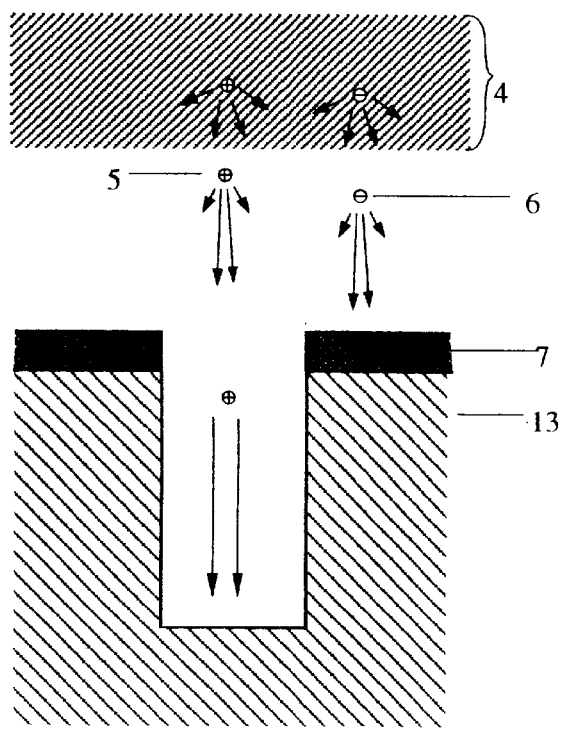
FIG. 21 shows the mechanism of reducing the subtrench and bowing according to this invention.
Figure 22:
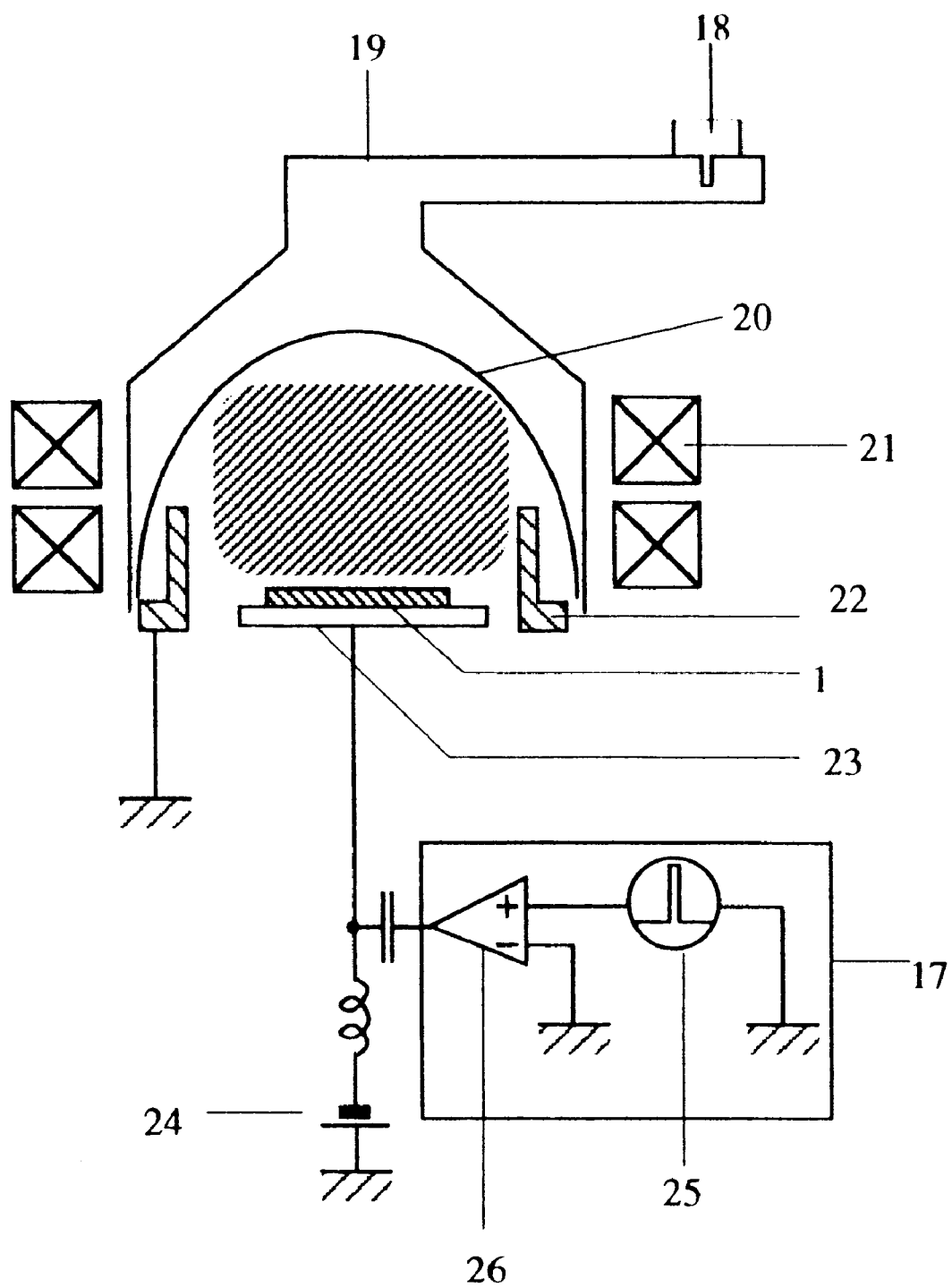
FIG. 22 is a construction diagram of the micro-wave etching system to which this invention is applied.
Figure 23:
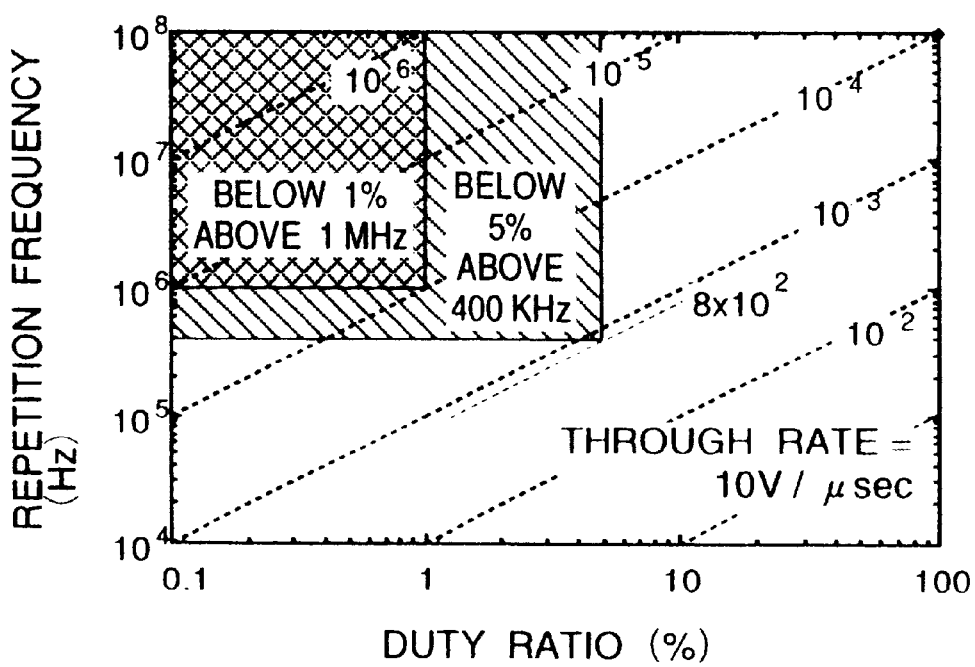
FIG. 23 is a graph showing the relation among the duty ratio and repetition frequency of the pulse and the through rate of the pulse source.
Figure 24:
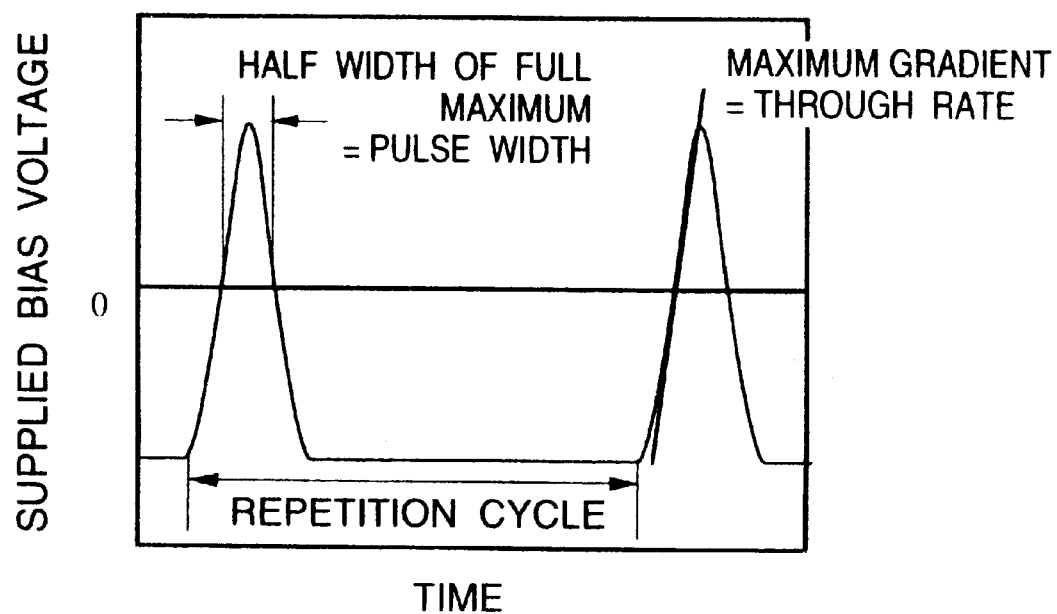
FIG. 24 is a graph showing one example of the pulse voltage wave generated from the pulse source.

FIG. 22 shows a micro-wave etching system for processing polycrystalline silicon for gate in which the pulse bias of the invention is used. In this system, a microwave generated from a magnetron 18 is introduced through a waveguide 19 into a discharge tube 20, and a high density plasma can be generated therein by the electron cyclotron resonance (ECR) between the introduced microwave and the magnetic field produced by a coil 21. In this system, the potential of this plasma is prevented from being much changed when the pulse is supplied, by grounding the plasma by an earthed electrode 22 of which the superficial area is four times or above as large as that of the substance 1 being treated. The substance 1 being etched is formed of a Si wafer of 6-inch size of which the surface was thermally oxidized, a polycrystalline silicon film deposited on the surface and a resist mask formed on the poly (polycrystalline) silicon film. This substance 1 is connected through an insulator 23 for electrostatic chucks which has an electrostatic capacitance of 30 pF/cm$^2$ to a constant voltage source 24 for electrostatic chucks and the pulse voltage source 17. In this invention, the pulse voltage source is required to have a high rising-up speed in order to generate a pulse voltage of a high frequency, low duty ratio and several hundred-V level. This rising-up speed is normally expressed by a value called through rate. The through rate is obtained by dividing the risen-up voltage by the rising-up time when the step voltage is generated, and it is peculiar to the pulse voltage generator. FIG. 23 shows minimum through rate of the pulse generator which can provide the given duty ratio and the given repetition frequency of the pulse voltage. In order to generate a pulse voltage of repetition frequency 400 KHz or above, duty ratio of 5% or below and several hundred-V level, it is necessary to use a pulse voltage source having a through rate of $8 \times 10^2$ V/$\mu$ sec or above. In order to generate a pulse voltage of repetition frequency 1 MHz or above and duty ratio of 1% or below, the through rate of the pulse voltage generator is necessary to be $10^4$ V/$\mu$ sec or above. The repetition frequency and duty ratio of the pulse which can be generated by the commercially available wide-band arbitrary-wave generator are 100 MHz or below and 0.1% or above, respectively. Thus, the pulse voltage source 17 in this embodiment is formed of this wide-band arbitrary-wave generator, 25 and a high-speed wide-band power amplifier 26 of through rate $10^5$ V/$\mu$ sec. The signal from the wide-band arbitrary-wave generator 25 is amplified by the high-speed wide-band power amplifier 26 to produce a pulse of repetition frequency 10 MHz, duty ratio 1% and several hundred-V level. FIG. 24 shows one example of the pulse waves which can be generated by this power supply. When a high-frequency pulse is generated, the pulse waveform is not always rectangular as shown in FIG. 24. In addition, the pulse is not linearly risen up. Therefore, the pulse width, the throughrate and the duty ratio-that is the function of the pulse width cannot be defined precisely. In this patent specification, the half-width of the full maximum of the pulse is defined as the pulse width, and the pulse width divided by the repetition frequency is defined as the duty ratio. Also, the through rate of the pulse is defined at the maximum gradient of the rising-up portion of the pulse.

The electron density and electron temperature were measured by the triple probe method in order to examine the state of the generated plasma in this system. The measured electron density and electron temperature were respectively $10^{11}$/cm$^3$ and 3 eV which are the same as the conditions of the above-mentioned simulation.

Figure 25:
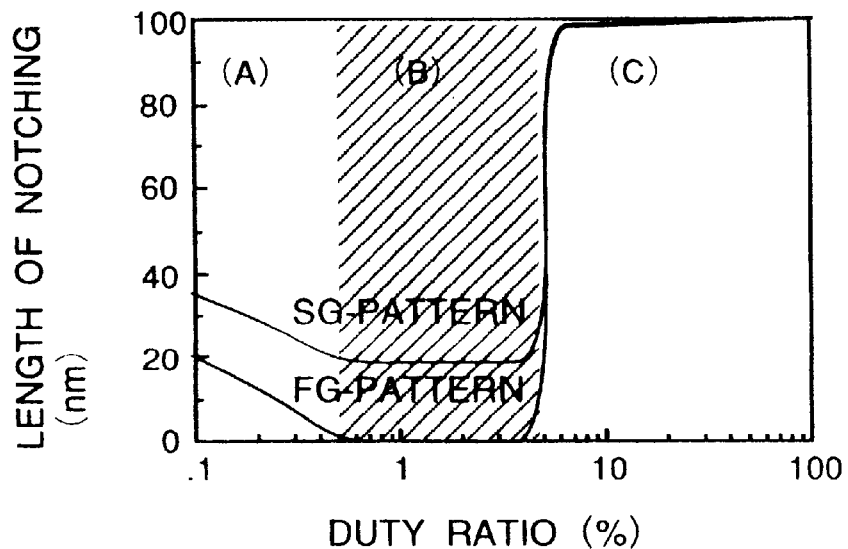
FIG. 25 is a graph showing the relation between the duty ratio of the pulse and the notch size.
Figure 43:
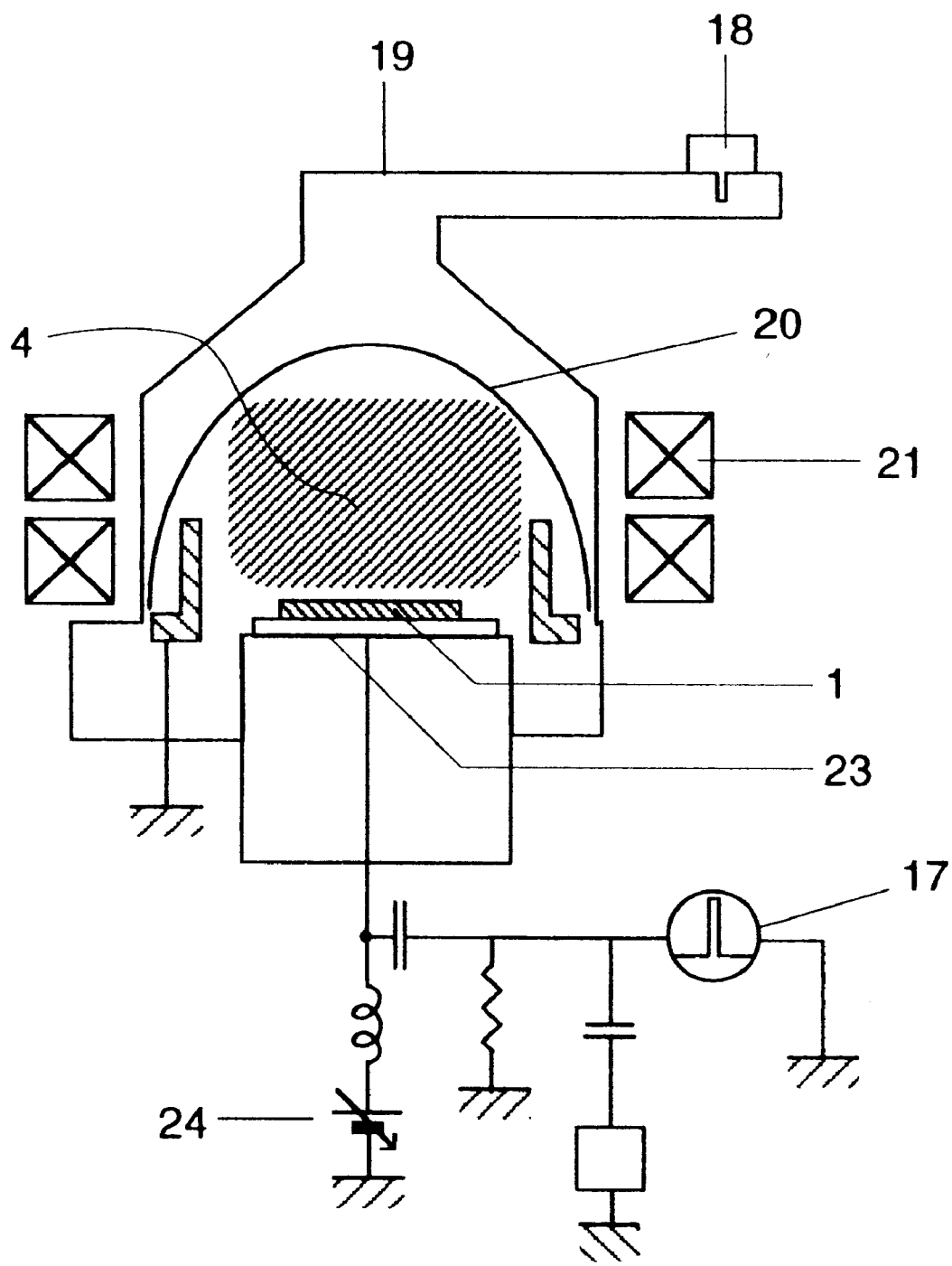
FIG. 43 is a construction diagram of the micro-wave etching system of the invention which is characterized in that the positive voltage is supplied from the power supply for electrostatic chucks.
Figure 46:
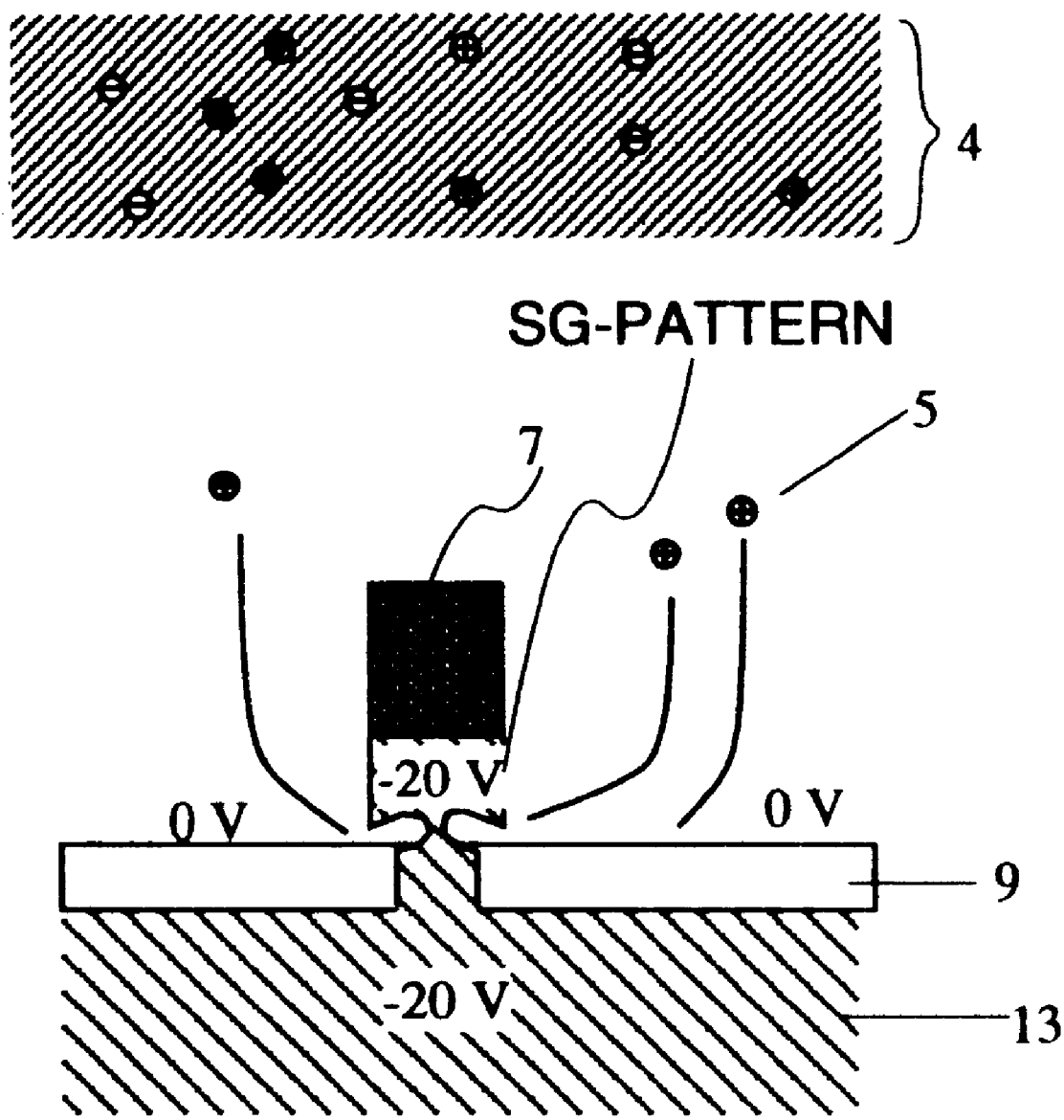
FIG. 46 shows the mechanism of generating the notching in SG pattern.

The polycrystalline silicon fine pattern formed on the silicon dioxide film was etched by using chlorine plasma in this system. At this time, if the height of the pulse is too small, the voltage for accelerating electrons is reduced so that the electrons cannot be forced to anisotropically impinge on the fine pattern. Therefore, the pulse height is necessary to be at least 20 V. However, if the pulse voltage is too large, the energy for accelerating the ions is increased to deteriorate the selectivity of the polycrystalline silicon relative to the silicon dioxide film. Therefore, the pulse height is desired to be 2 KV or below. In this embodiment, the pulse voltage was fixed to 100 V, and first the notch size was examined with the repetition frequency set to 10 MHz and with the duty ratio changed. FIG. 25 shows the results. From the figure, it will be seen that the notch size becomes the minimum when the duty ratio is in the range from 0.5% to 5%. Particularly in the pattern which is not conductive to the silicon substrate (hereinafter, called FG pattern), the notch size is zero when the duty ratio is in this range. In the pattern which is conductive to the substrate (hereinafter, called SG pattern), the notching does not completely disappear. We found that the incomplete disappearance of the notching in the SG pattern is ascribed to the negative DC voltage supplied from the voltage source 24 for electrostatic chucks. FIG. 46 shows the mechanism of generating this difference. When a negative voltage of, for example, −500 V is supplied as a voltage for electrostatic chucks, there appears on the rear substrate 13 a potential which is about 20 V lower than that on the surface of the underlying dioxide film 9. Therefore, since the potential on the SG pattern which is conductive to the substrate is about 20 V lower than that on the surrounding dioxide film, the positive ions 5 are deflected to the SG pattern side to be easy to obliquely impinge. The obliquely impinging ions promote the generation of the notching. Thus, when a voltage of +500 V or above is supplied from the voltage source by changing the polarity of the voltage source for electrostatic chucks as shown in FIG. 43, the SG pattern is held at a potential which is 20 V higher than that on the surrounding dioxide film 9. Accordingly, it is hard for the positive ions to obliquely impinge on the SG pattern. The same measurement as in FIG. 25 was made by use of this system. In this case, when the duty ratio was in the range from 0.5% to 5%, the notching completely disappeared not only from the FG pattern but also from the SG pattern.

Figure 26:
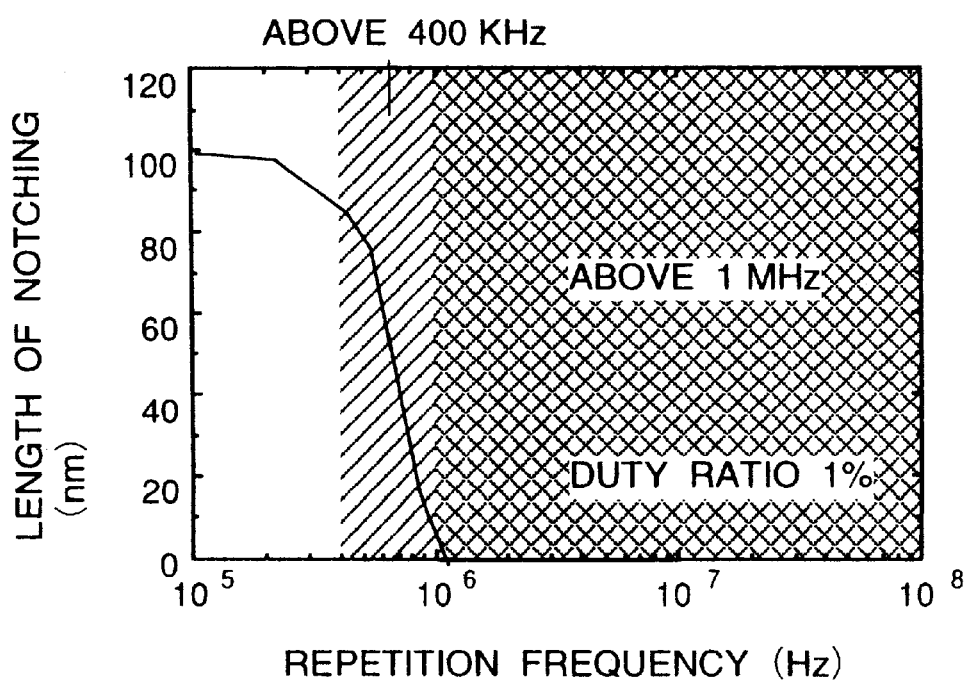
FIG. 26 is a graph showing the relation between the repetition frequency of the pulse and the notch size.

Then, the change of the notch size on the FG pattern was examined with the duty ratio set to 1% and with the repetition frequency changed. FIG. 26 shows the result. From FIG. 26, it will be seen that the notch size is decreased with the increase of the repetition frequency. Particularly, when the repetition frequency is 400 KHz or above, the notch size is remarkably reduced, or effect on the notch reduction is large.

Figure 44:
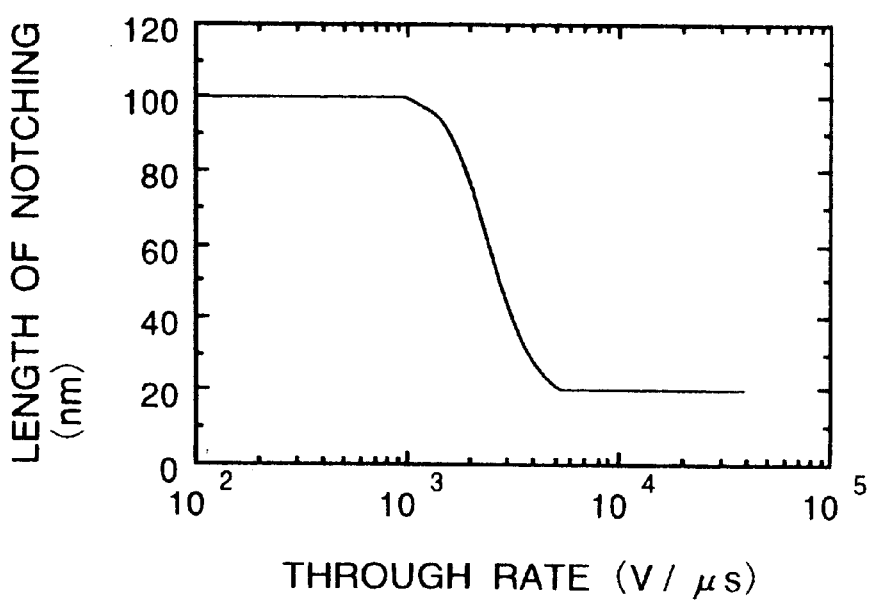
FIG. 44 is a graph showing the relation between the through rate of the pulse and the magnitude of the electron accelerating voltage.

In addition, the through rate of the pulse was examined. The change of the notch size on the FG pattern with respect the through rate of the pulse was measured with the pulse voltage selected to be 100 V, pulse width set to 100 ns and repetition frequency fixed to 10 KHz. FIG. 44 shows the result. From FIG. 44, it will be understood that the notch size starts decreasing at a through rate of $10^3 V/\mu s$ and becomes the minimum at $5 \times 10^3 V/\mu s$ or above.

Figure 27:
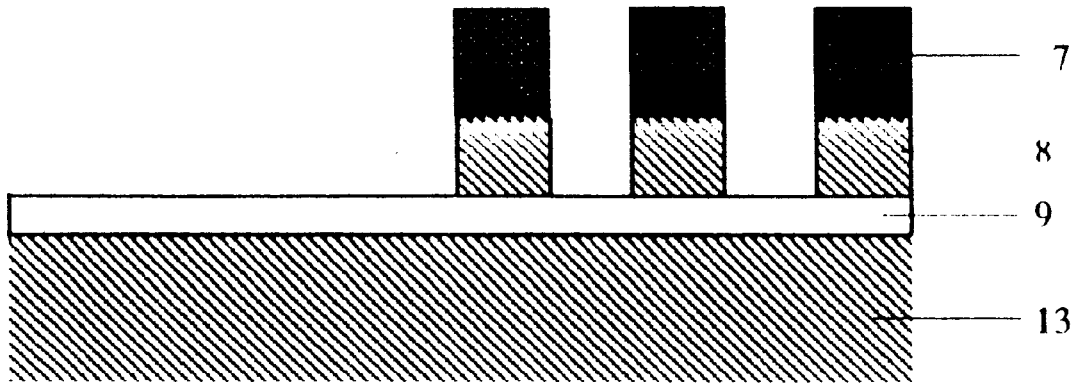
FIG. 27 shows the shape of poly (polycrystalline) silicon for gate worked according to this invention.
Figure 28:
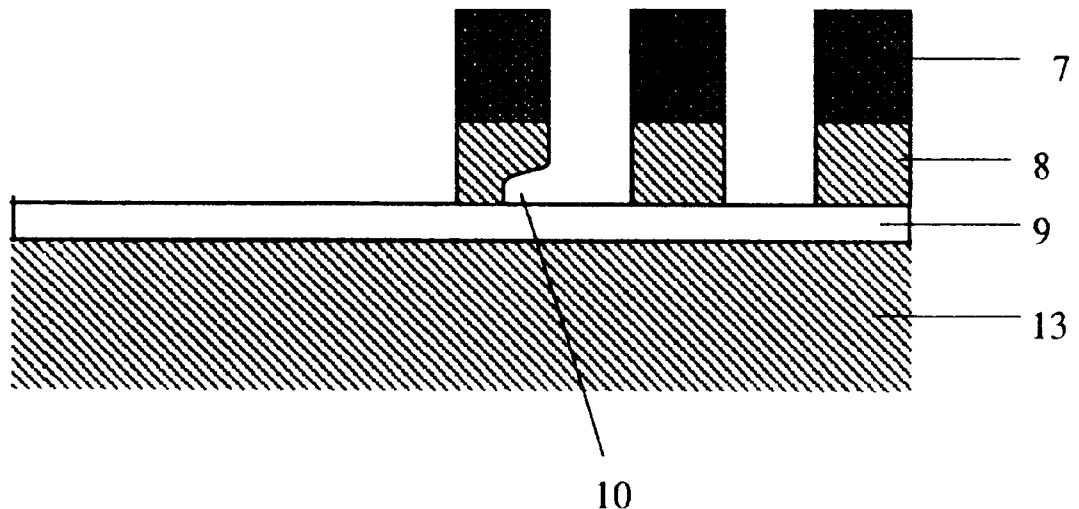
FIG. 28 shows the shape of polycrystalline silicon for gate worked according to the conventional method.

The fine patterns of polycrystalline silicon were etched by supplying a pulse voltage of repetition frequency 10 MHz, duty ratio 1% and height 100 V in the system of this embodiment. FIG. 27 shows the shape of the processed polycrystalline silicon. For reference, the shape of the polycrystalline silicon etched by RF bias is shown in FIG. 28. When the RF bias was used the notch appeared, but when the pulse bias was used the notch disappeared with the result that the etched shape became anisotropic.

The effect of this embodiment can be achieved not only by the microwave etching system, but also by plasma etching systems using other discharge systems such as an inductively couled plasma etching system and a Helicon plasma etching system.

Embodiment 2

The metal wiring process was carried out by the system of the embodiment 1.

Figure 29:
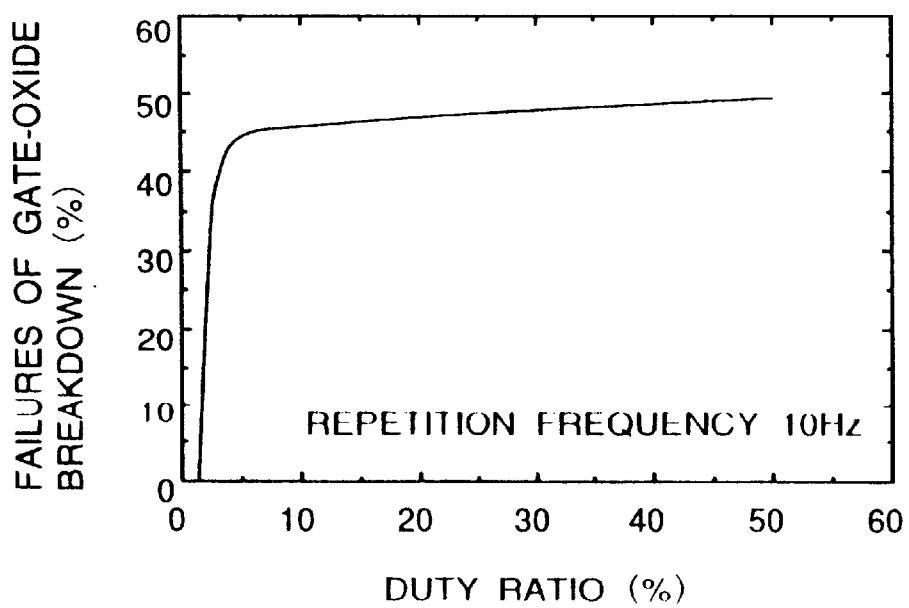
FIG. 29 is a graph showing the relation between the duty ratio of the pulse and the dielectric breakdown rate of the gate oxide film.
Figure 30:
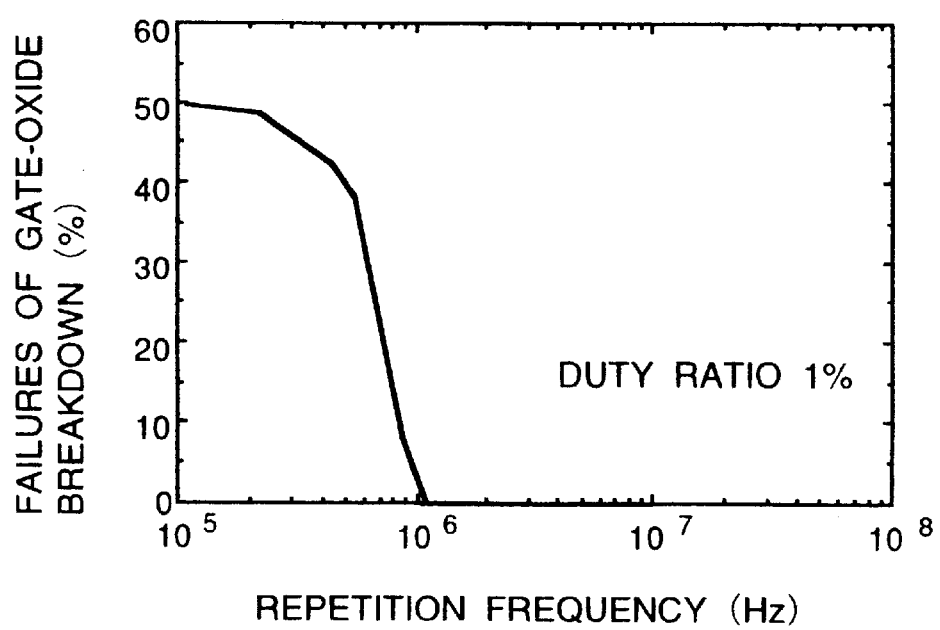
FIG. 30 is a graph showing the relation between the repetition frequency of the pulse and the dielectric breakdown rate of the gate oxide film.

First, the change of the dielectric breakdown rate of the gate oxide film with respect to the duty ratio was examined with the repetition frequency set to 10 MHz. FIG. 29 shows the result. From FIG. 29, it will be seen that the rate of the dielectric breakdown is decreased with a decrease of the duty ratio of the pulse. Particularly when the duty ratio is 5% or below, the rate of the dielectric breakdown is suddenly decreased, thus the effect of reducing the charge build-up damage being increased in the metal wiring etching process. Then, the change of the dielectric breakdown rate of the gate oxide film with respect to the repetition frequency at the duty ratio of 1% was examined. FIG. 30 shows the result. As seen from FIG. 30, the dielectric breakdown rate is decreased with the increase of the repetition frequency. Particularly when the repetition frequency is 400 KHz or above, the dielectric breakdown rate is remarkably reduced, and thus the effect of reducing the charge build-up damage is large.

The charge build-up and notch phenomena due to the electron shading are caused during over-etching after the residual film thickness of the etched film becomes zero, or after just etching. Therefore, there is no need to supply the pulse bias of this system for all the time from the beginning to the end of etching. That is, the pulse bias of this system has to be supplied only during the over-etching after just etching, and in this case the charge build-up and notch can be reduced. Thus, methods of switching bias voltages before and after the just etching are proposed in the following embodiments 3, 4 and 5.

Embodiment 3

Figure 31:
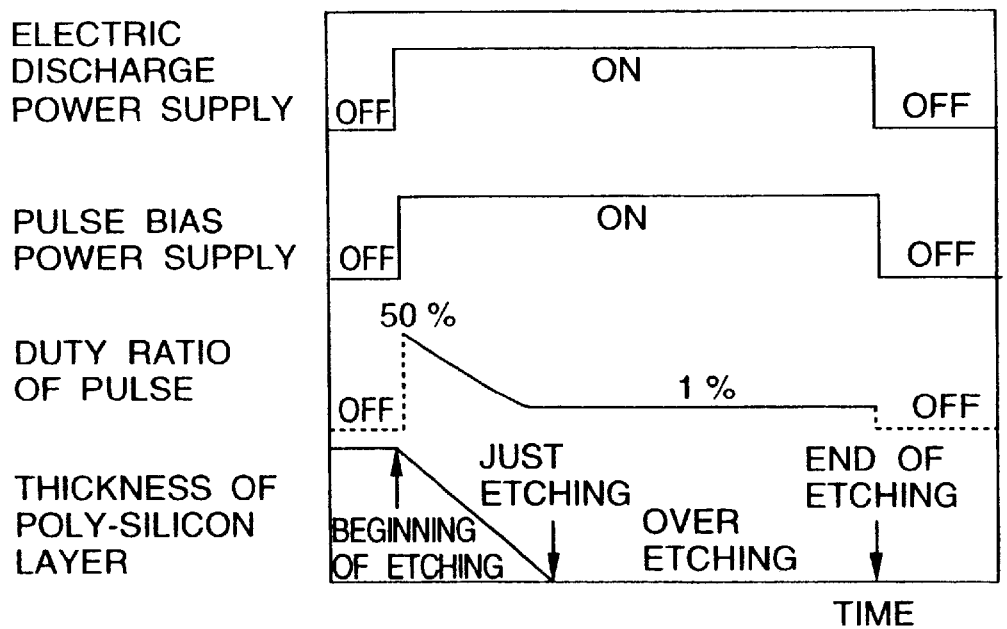
FIG. 31 is a timing chart showing the change of the duty ratio of the pulse during etching.

The polycrystalline silicon for gate was processed by using the system of embodiment 1. In this embodiment 3, the repetition frequency of the pulse was set to 10 MHz, and the duty ratio of the pulse was changed from 50% to 1% during the interval from the start of the etching to when the residual polycrystalline silicon film thickness becomes zero, or to the just etching time as shown in the timing chart of FIG. 31. In addition, during the over etching after the just etching, the duty ratio of the pulse was fixed to 1%. In this case, too, the processed polycrystalline silicon shapes were anisotropic without notch as in FIG. 27.

Although in this embodiment the duty ratio of the pulse was fixed to 1% after the just etching, the same effect was achieved even when the duty ratio of the pulse was fixed to 1% before the just etching.

In addition, the method of this embodiment is effective not only when the notch is reduced in the polycrystalline silicon processing for gate, but also when the charge build-up damage is reduced in the metal wiring etching.

Embodiment 4

Figure 32:
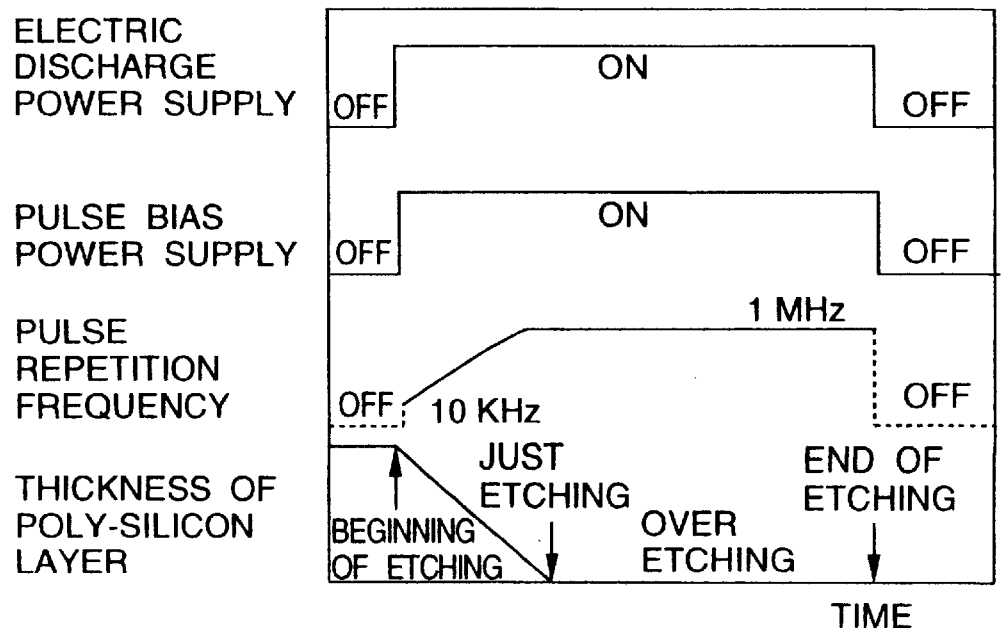
FIG. 32 is a timing chart showing the change of the repetition frequency of the pulse during etching.

The polycrystalline silicon for gate was processed by use of the system of embodiment 1. In this embodiment 4, the duty ratio of the pulse was fixed to 1%, and the repetition frequency of the pulse was changed from 10 KHz to 10 MHz during the interval from the start of the etching to the just etching time as shown in the timing chart of FIG. 32. In addition, during the over etching after the just etching, the repetition frequency was fixed to 10 MHz. In this case, too, the processed polycrystalline silicon shapes were anisotropic without notch as in FIG. 27.

Although in this embodiment the repetition frequency of the pulse was fixed to 10 MHz after the just etching, the same effect was achieved even when the repetition frequency of the pulse was fixed to 10 MHz before the just etching.

In addition, the method of this embodiment is effective not only when the notch is reduced in the polycrystalline silicon processing for gate, but also when the charge build-up damage is reduced in the metal wiring etching.

Embodiment 5

Figure 33:
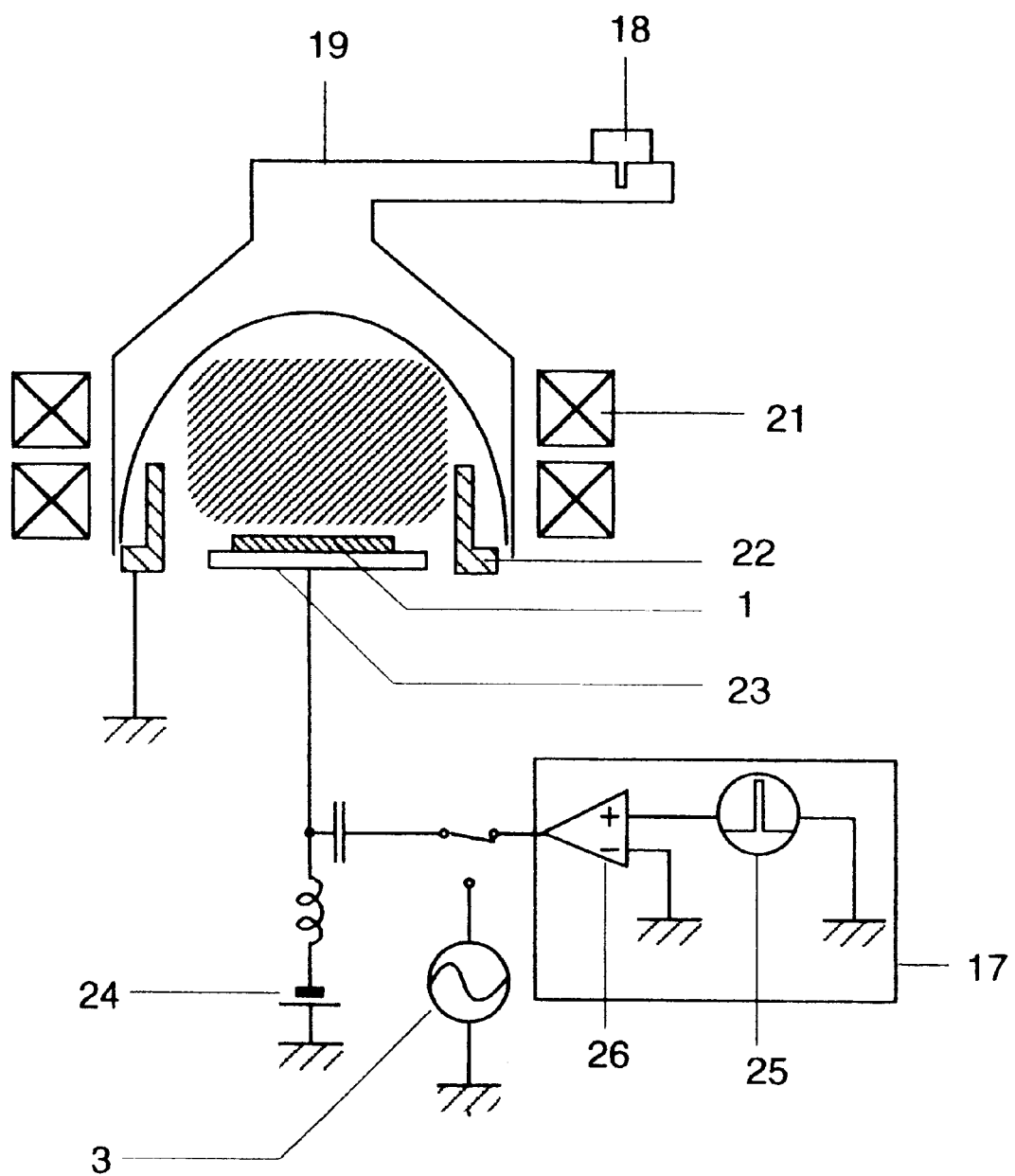
FIG. 33 is a construction diagram of the micro-wave etching system capable of switching between the pulse bias and the RF bias.
Figure 34:
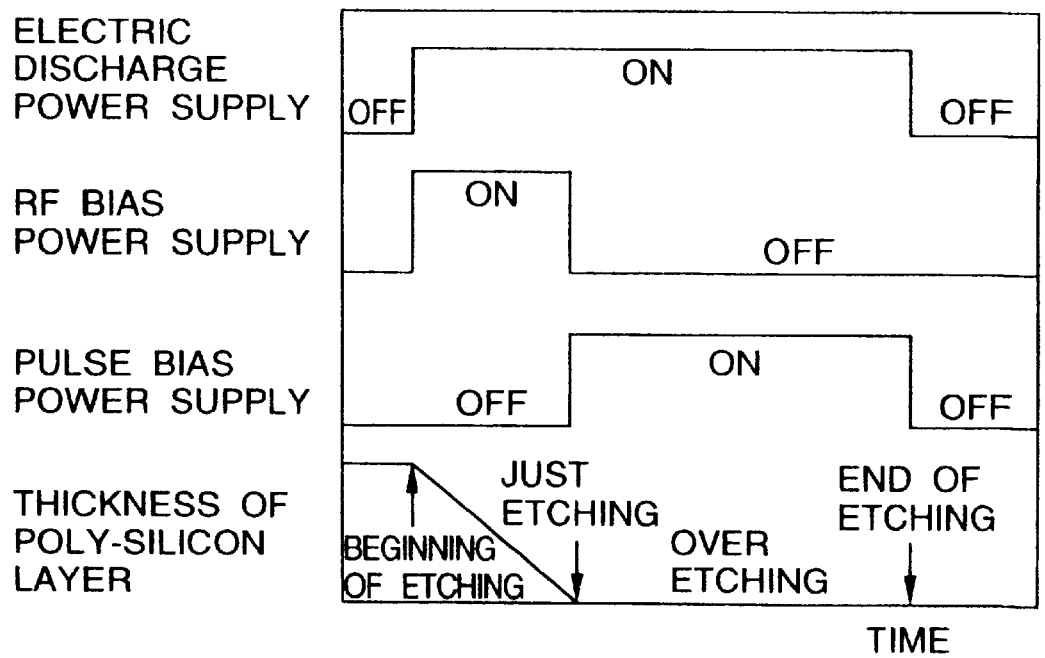
FIG. 34 is a timing chart showing the switching between the pulse bias and the RF bias.

The polycrystalline silicon for gate was etched by use of the plasma etching system which, as shown in FIG. 33, can supply any one of a pulse voltage and a sine-wave voltage as a bias. In this embodiment 5, as shown in the timing chart of FIG. 34, a sine-wave voltage of 10 MHz was supplied until the just etching was reached, and during the over etching the pulse voltage was switched to a pulse voltage of duty ratio 1% and repetition frequency 10 MHz. In this case, too, the processed polycrystalline silicon shapes were anisotropic without notch as in the embodiment 1.

Although in this embodiment the bias voltage was switched from the sine-wave to the pulse at the just etching time, this bias switching may be made before the just etching, and in this case the same effect can be achieved.

In addition, the method of this embodiment is effective not only when the notch is reduced in the polycrystalline silicon processing for gate, but also when the charge build-up damage is reduced in the metal wiring etching.

Embodiment 6

Figure 35:
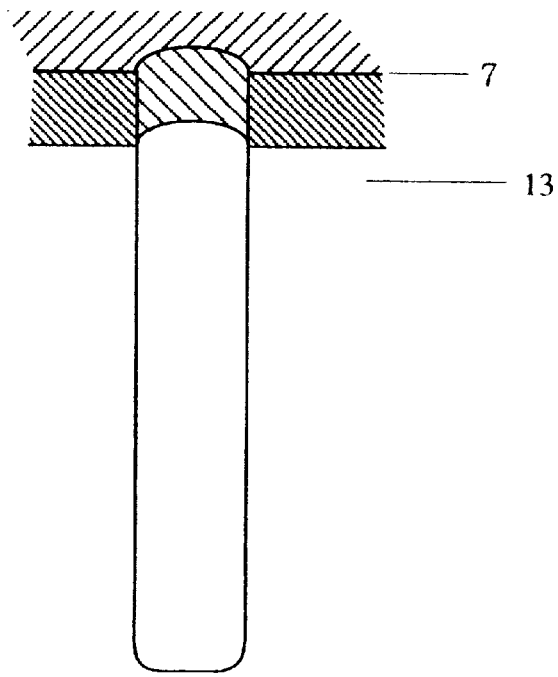
FIG. 35 shows the shape of the trench produced according to this invention.
Figure 36:
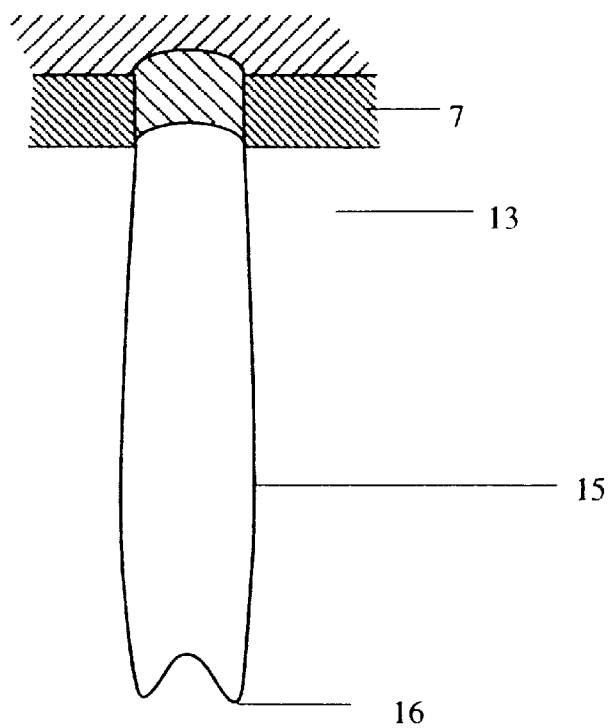
FIG. 36 shows the shape of the trench produced according to the conventional method.

The pulse voltage of repetition frequency 10 MHz and duty ratio of 1% was supplied for trench etching by use of the system of embodiment 1. FIG. 35 shows the cross section of the produced trench. For reference, the cross section of the trench produced by normal RF bias etching is shown in FIG. 36. The bowing 15 and subtrench 16 which appeared when the RF bias was used disappeared when the pulse bias of the invention was supplied, and thus the cross section had an anisotropic shape with the bottom corners rounded. Also, the pattern size dependency of the etching speed called microloading disappeared.

While in this embodiment the trench working was described, the same effect can be achieved in the processes for producing holes such as contact holes and for producing minute trenches such as U-trench for isolation.

Embodiment 7

The pulse wave voltage of this system can be considered to have the effect of reducing the notch and charge build-up even if a noise wave voltage or the like is superimposed on the pulse voltage provided that this noise voltage is negligible as compared with the pulse voltage.

Figure 37:
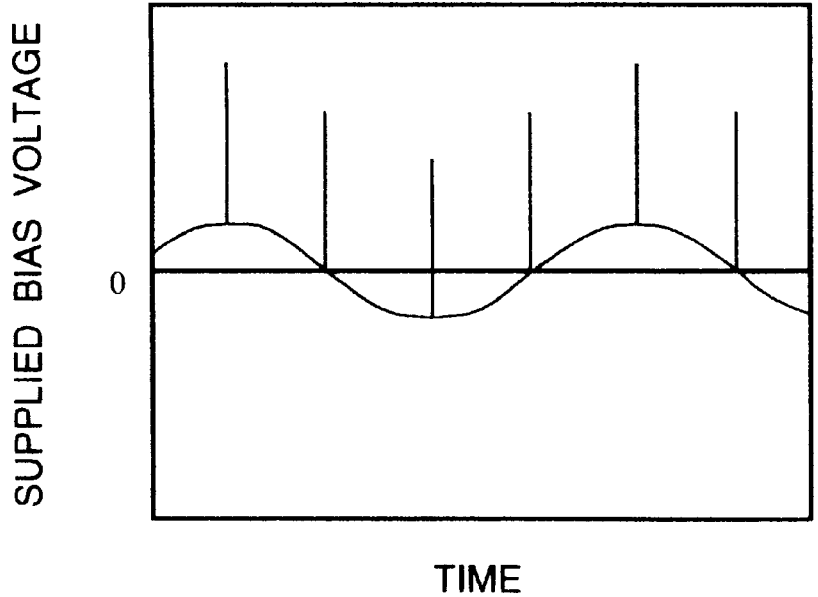
FIG. 37 is a waveform diagram of an example of the input pulse voltage according to this invention.

Thus, in this embodiment, a composite wave voltage formed of a pulse voltage and a sine wave as shown in FIG. 37 was generated from the pulse generator in FIG. 22 and supplied as a bias to etch the polycrystalline silicon for gate. In this case, too, the notch reduction effect can be achieved as in the embodiment 1.

While in this embodiment a sine-wave voltage of which the cycle is twice as long as that of the pulse was superimposed on the pulse voltage, the same effect as in this embodiment can be achieved irrespective of the cycle and amplitude of the sine-wave voltage to be superimposed on the pulse voltage.

In addition, the method of this embodiment is effective not only for reducing the notch in the working of polycrystalline silicon for gate, but also for reducing the charge build-up damage in the metal wiring etching and the bowing and subtrench in the process for minute holes such as trench.

Embodiment 8

Figure 38:
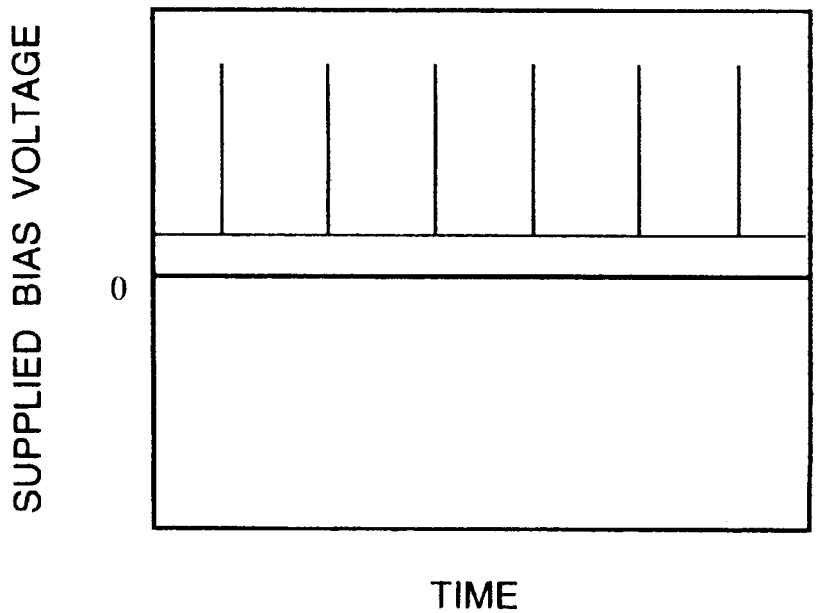
FIG. 38 is a waveform diagram of an example of the input pulse voltage according to this invention.
Figure 40:
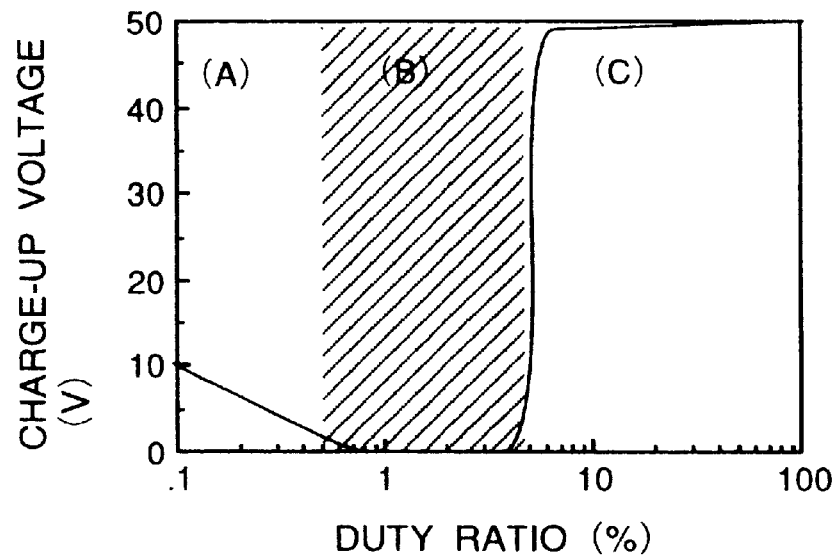
FIG. 40 is a graph showing the relation between the duty ratio of the pulse and the charge build-up magnitude.
Figure 41:
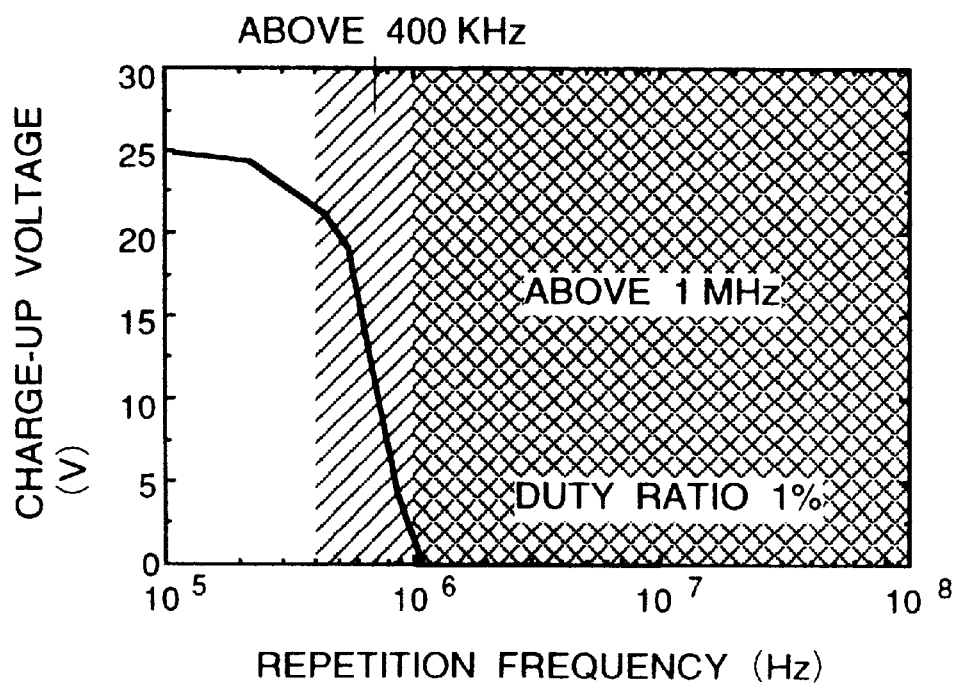
FIG. 41 is a graph showing the relation between the repetition frequency of the pulse and the charge build-up magnitude.
Figure 42:
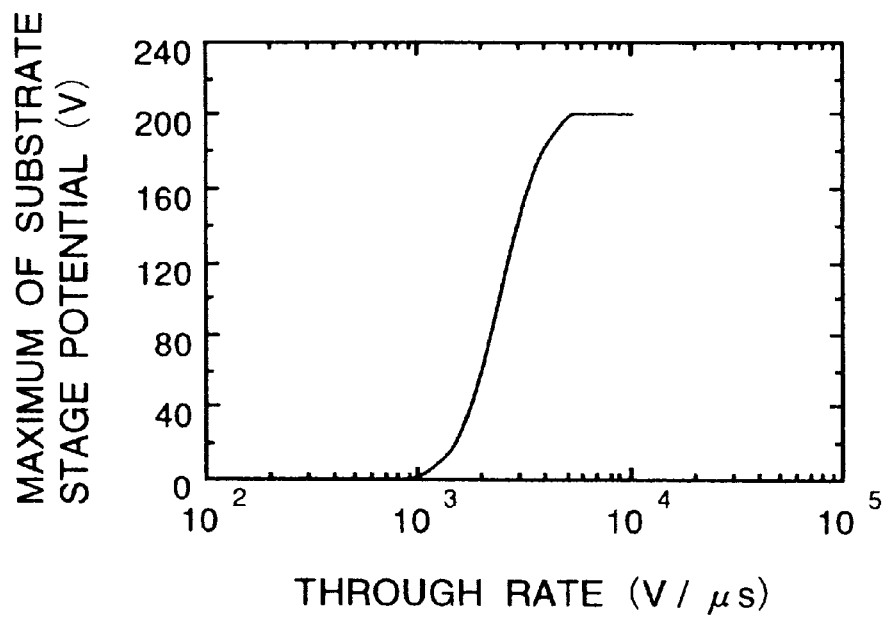
FIG. 42 is a graph showing the relation between the through rate of the pulse and the magnitude of the electron accelerating voltage.

In the system of embodiment 1, a composite wave voltage formed of a pulse voltage and a positive DC voltage as shown in FIG. 38 was generated from the pulse generator and supplied as a bias to etch the polycrystalline silicon for gate. In this case, too, the notch reducing effect was achieved as in the embodiment 1. While in this embodiment a positive DC voltage was superimposed on the pulse voltage, the same effect as in this embodiment can be achieved irrespective of the magnitude and polarity of the DC voltage superimposed on the pulse voltage.

In addition, the method of this embodiment is effective not only for reducing the notch in the working of polycrystalline silicon for gate, but also for reducing the charge build-up damage in the metal wiring etching and the bowing and subtrench in the process for minute holes such as trench.

Embodiment 9

A ferroelectric material of Pb (Zr, Ti) $O_3$ was used to make the insulator 23 for electrostatic chucks in the system of embodiment 1. As a result, the electrostatic capacitance of the insulator 23 was increased to 3 $nF/cm^2$ or above. The repetition frequency of the pulse necessary for eliminating the charge build-up due to the electron shading phenomenon was able to be reduced by two digits by this improvement. Thus, since the through rate of the pulse voltage source can be reduced by two digits, the cost of the pulse voltage source can be decreased.

Figure 39:
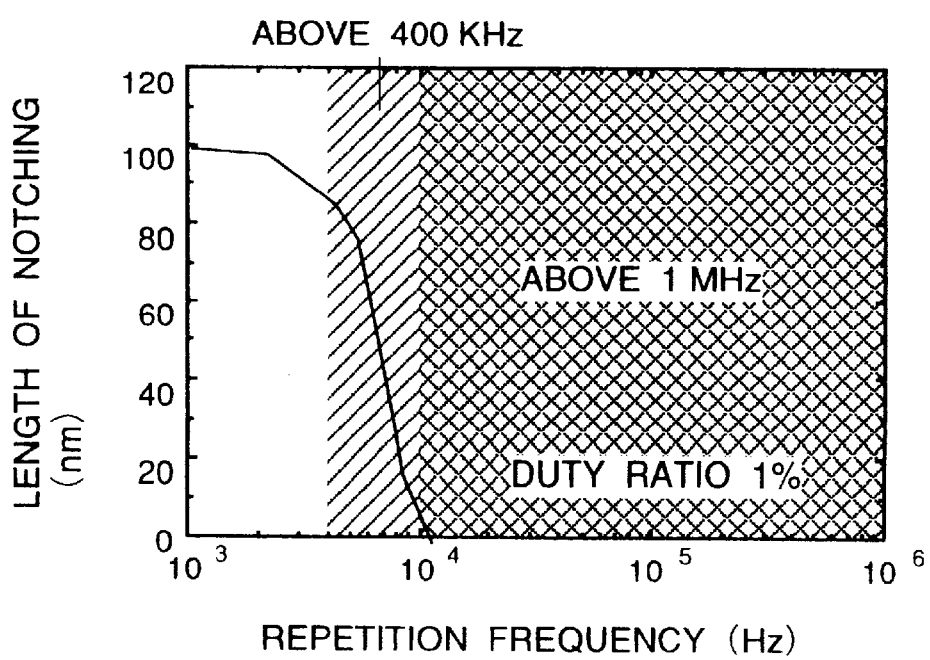
FIG. 39 is a graph showing the relation between the repetition frequency of the pulse and the notch size in the etching system of the embodiment 9.

The polycrystalline silicon for gate was processed by the improved system. The change of the notch size with respect to the repetition frequency was examined with the pulse voltage set to 100 V and with the duty ratio of the pulse fixed to 1%. FIG. 39 shows the result. From FIG. 39, it will be seen that the notch size starts to be suddenly reduced at repetition frequency 4 KHz or above and reaches almost zero at repetition frequency 10 KHz or above. In addition, when a pulse voltage of repetition frequency 100 KHz was supplied to etch, the shape of the etched polycrystalline silicon was as anisotropic as that shown in FIG. 27.

While in this embodiment Pb (Zr, Ti) $O_3$ was used for making the insulator for electrostatic chucks, other ferroelectrics may be used and in this case, similar effect can be achieved. For example, when (Pb, Ba) $Nb_2O_6$ was used, the threshold frequency can be reduced to 1/200 that in the embodiment 1. In addition, the threshold frequency can be reduced to 1/50 by (Sr, Ba) $Nb_2O_6$, to 1/300 by $BaTiO_3$, to 1/10 by $PbTiO_3$, to 1/30 by $Bi_4Ti_3O_{12}$, and to 1/2000 by a solid solution of Pb (Mg, Nb) $O_3$-$PbTiO_3$.

Embodiment 10

Figure 45:
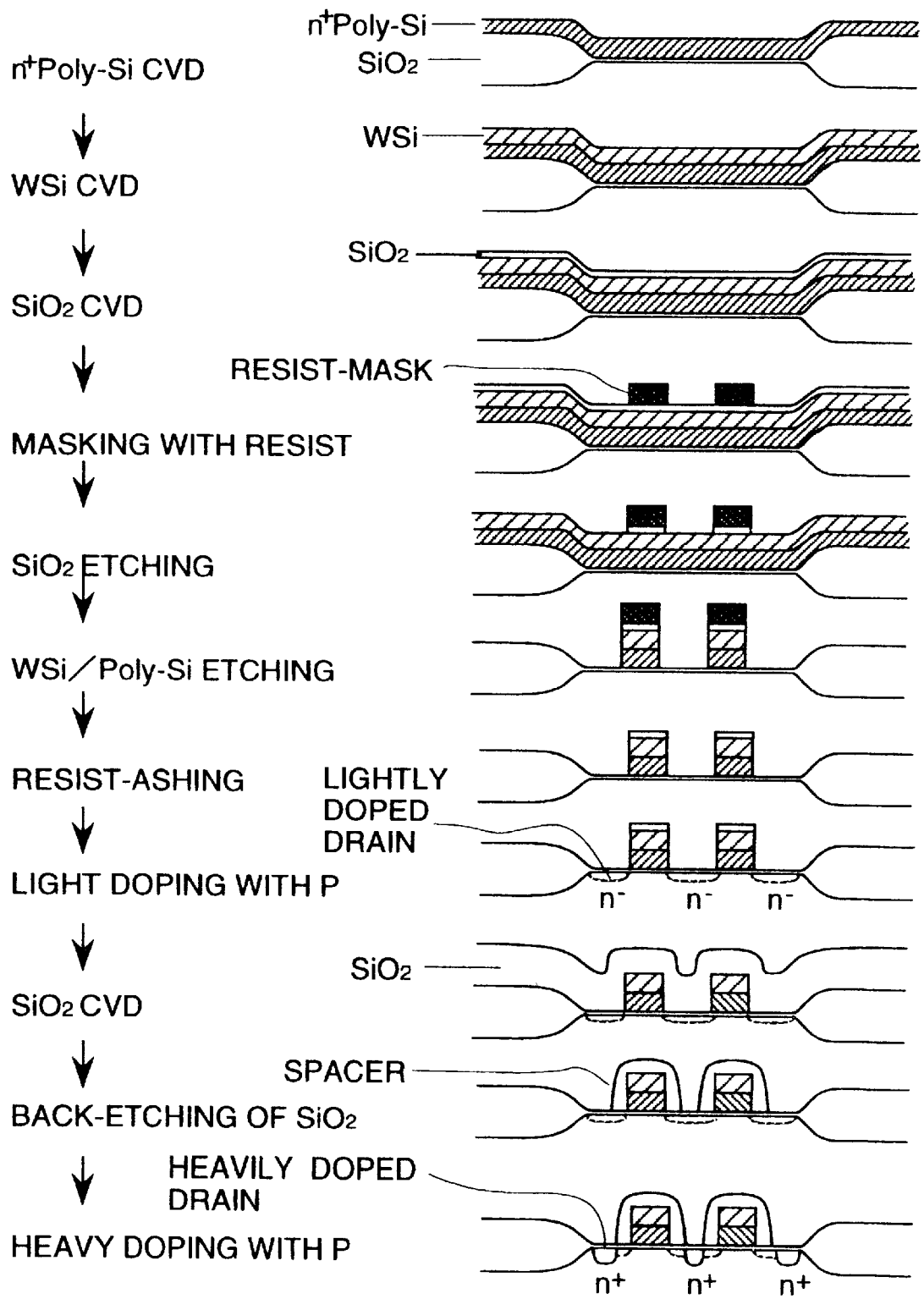
FIG. 45 is a flow diagram of the processes for WSi/Polycrystalline-Si gate.

FIG. 45 is a flow diagram of processes for WSi/Polycrystalline-Si gate. Referring to FIG. 45, first, n+Polycrystalline-Si, WSi, and $SiO_2$ are sequentially deposited on a silicon dioxide film by CVD. Then, a photoresist is coated over the substrate, and patterning is made by lithography to form a resist pattern. This resist pattern is used as a mask, and the $SiO_2$ layer is anisotropically dry-etched through the mask by $CF_4/O_2$ mixture gas plasma. Then, both the WSi layer and Polycrystalline-Si layer are anisotropically dry-etched by $Cl_2$ gas plasma. Then, the resist pattern is removed by downflow ashing. Then, the remaining $SiO_2$/WSi/Polycrystalline-Si is used as a mask, and phosphorus is lightly doped through the mask so that an n-light doped drain layer is formed in the Si substrate. Thereafter, Silicon dioxide $SiO_2$ is deposited by CVD, and it is etched back to form a spacer on the outer periphery of the gate. This spacer is used as a mask, and phosphorus is heavily doped through the mask to form an n+diffusion layer. The pulse bias of this embodiment was used in the WSi/Polycrystalline-Si film etching process of the production processes shown in FIG. 45. A description will be made of a bias application method in the WSi/Polycrystalline-Si etching process. Since a high bias voltage was necessary for the WSi layer etching after the start of discharge, the RF bias was supplied which is able to make a high bias with ease. In the following Polycrystalline-Si layer etching, since high selectivity and little notching were required, the bias voltage was switched from RF bias to pulse bias at the start of the Polycrystalline-Si layer etching. The gate produced as above has higher-precision dimensions and thus less dispersion in its effective channel length than that produced by the convention method. In addition, the gate can be produced to have stable characteristics since the gate oxide film is little damaged by the charge build-up and since the Vt shift is also small.

As described above, the charge build-up due to the electron shading phenomenon can be reduced, and as a result the notch, charge build-up damage, bowing and subtrench due to the electron shading can be suppressed from generation. Also, the microloading can be effectively reduced.

What is claimed is:

1. A plasma etching system comprising means for supplying a plasma to a substance to be etched which is placed in a pressure-reduced chamber, and means for supplying a bias voltage to said substance to be etched so as to suppress electron shading, wherein said means for supplying said bias voltage includes a power amplifier of which the through rate is $8 \times 10^2 V/\mu$ sec or above or a pulse voltage generator of which the through rate is $8 \times 10^2 V/\mu$ sec or above.

2. A plasma etching system comprising means for supplying a plasma to a substance to be etched which is placed in a pressure-reduced chamber, and means for supplying a pulse bias voltage to said substance to be etched so as to suppress electron shading, wherein said means for supplying said pulse bias voltage includes a power amplifier of which the through rate is $8\times10^4 V/\mu$ sec or above or a pulse voltage generator of which the through rate is $8\times10^4 V/\mu$ sec or above.

3. An etching system comprising means for supplying a plasma to a substance to be etched which is placed in a pressure-reduced chamber, and means for supplying a bias voltage to said substance to be etched so as to suppress electron shading, said bias voltage having negative and positive voltage cycles, wherein said means for supplying said bias voltage includes a power amplifier of which the through rate is $8\times10^2 V/\mu$ sec or above or a pulse voltage generator of which the through rate is $8\times10^2 V/\mu$ sec or above.

4. An etching system comprising means for supplying a plasma to a substance to be etched which is placed in a pressure-reduced chamber, and means for supplying a bias voltage to said substance to be etched so as to suppress electron shading, said bias voltage having negative and positive voltage cycles, wherein said means for supplying said bias voltage includes a power amplifier of which the through rate is $8\times10^4 V/\mu$ sec or above or a pulse voltage generator of which the through rate is $8\times10^4 V/\mu$ sec or above.

5. A dry-etching system comprising means for supplying a plasma to a substance to be etched which is placed in a pressure-reduced chamber, and means for supplying a bias voltage to said substance to be etched so as to suppress electron shading, wherein said means for supplying said voltage includes a power amplifier or pulse generator for generating a positive pulse-wave voltage having a duty ratio and a repetition frequency such that a maximum value of a potential of said substance during the treatment is larger than a potential of said plasma, and the through rate of said pulse-wave voltage is $10^3 V/\mu$ sec or above.

6. dry-etching system comprising means for supplying a plasma to a substance to be etched which is placed in a pressure-chamber, an electro-static chuck mechanism for making said substance to stick fast to a table within said chamber, and means for supplying a pulse-wave bias voltage to said substance being etched so as to suppress electron shading, wherein said electrostatic chuck mechanism includes an insulator of which the electrostatic capacitance per unit area is 3 $nF/cm^2$ or above.

7. A dry-etching system according to claim 6, wherein said insulator is formed of a ferroelectric material.

8. A dry-etching system according to claim 6, wherein said means for supplying a pulse-wave bias voltage supplies a positive pulse-wave voltage of a repetition frequency of 400 KHz or above and a duty ratio of 5% or below to enable etching of said substance being etched.

9. A plasma etching system according to claim 1, wherein said bias voltage has negative and positive voltage cycles.

10. A plasma etching system according to claim 9, wherein a time period of the positive voltage cycle is substantially shorter than a time period of the negative voltage cycle.

11. A plasma etching system according to claim 1, wherein said substance to be etched which is placed in the pressure-reduced chamber, has a first superficial area, and further comprising an earthed electrode provided within the pressure-reduced chamber having a second superficial area which is at least four times greater than the first superficial area of the substance to be etched.

12. A plasma etching system according to claim 2, wherein the pulse bias voltage has a negative voltage period and a positive voltage period.

13. A plasma etching system according to claim 12, wherein the period of the positive voltage period is substantially shorter than the period of the negative voltage period.

14. An etching system according to claim 3, wherein said substance to be etched which is placed in the pressure-reduced chamber, has a first superficial area, and further comprising an earthed electrode provided within the pressure-reduced chamber having a second superficial area which is at least four times greater than the first superficial area of the substance to be etched.

15. A dry-etching system according to claim 6, wherein the pulse-wave bias voltage has a negative voltage period and a positive voltage period.

* * * * *

UNITED STATES PATENT AND TRADEMARK OFFICE
CERTIFICATE OF CORRECTION

PATENT NO.    : 6,332,425 B1
DATED         : December 25, 2001
INVENTOR(S)   : Kofuji et al.

It is certified that error appears in the above-identified patent and that said Letters Patent is hereby corrected as shown below:

<u>Title page,</u>
Please insert -- [73] Assignee:   Hitachi, Ltd., Tokyo, Japan -- after "[75] Inventors"

Signed and Sealed this

Fourth Day of June, 2002

*Attest:*

*Attesting Officer*

JAMES E. ROGAN
*Director of the United States Patent and Trademark Office*